(12) United States Patent
Ikeda et al.

(10) Patent No.: US 11,757,454 B2
(45) Date of Patent: Sep. 12, 2023

(54) DELAY SYNCHRONIZATION CIRCUIT, CLOCK TRANSMISSION CIRCUIT, AND CLOCK TRANSMISSION AND RECEPTION CIRCUIT

(71) Applicant: Mitsubishi Electric Corporation, Tokyo (JP)

(72) Inventors: Sho Ikeda, Tokyo (JP); Koji Tsutsumi, Tokyo (JP); Masaomi Tsuru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/948,993

(22) Filed: Sep. 20, 2022

(65) Prior Publication Data

US 2023/0017177 A1 Jan. 19, 2023

Related U.S. Application Data

(63) Continuation of application No. PCT/JP2021/015001, filed on Apr. 9, 2021.

(30) Foreign Application Priority Data

Apr. 15, 2020 (WO) .................. PCT/JP2020/016543

(51) Int. Cl.
*H03L 7/081* (2006.01)

(52) U.S. Cl.
CPC .................................... *H03L 7/081* (2013.01)

(58) Field of Classification Search
CPC ...................................................... H03L 7/081
See application file for complete search history.

(56) References Cited

U.S. PATENT DOCUMENTS 6,356,122 B2 * 3/2002 Sevalia ..................... H03L 7/23
327/299
7,869,853 B1 * 1/2011 Say ..................... A61M 5/1723
600/347

(Continued)

FOREIGN PATENT DOCUMENTS

CN 101354438 A * 1/2009
CN 201259547 Y * 6/2009

(Continued)

OTHER PUBLICATIONS

International Search Report for PCT/JP2021/015001 (PCT/ISA/210) dated Jun. 29, 2021.

(Continued)

*Primary Examiner* — Adam D Houston
(74) *Attorney, Agent, or Firm* — Birch, Stewart, Kolasch & Birch, LLP

(57) ABSTRACT

A delay synchronization circuit includes a pulse synthesizing circuit to generate a synthesized signal including a first pulse signal synchronized with a reference signal and a second pulse signal synchronized a feedback signal, a VCDL to delay the synthesized signal g and output a delayed synthesized signal, a pulse separation circuit to generate a first separation signal synchronized with a first pulse signal included in the delayed synthesized signal and generate a second separation signal synchronized with a second pulse signal included in the delayed synthesized signal, a circulator to output a first separation signal to a clock reception circuit and then output the first separation signal returned from the clock reception circuit to the pulse synthesizing circuit as the feedback signal, and a delay-amount control circuit to control a delay amount of the delayed synthesized signal according to a phase difference between the reference signal and the second separation signal.

17 Claims, 20 Drawing Sheets

(56) References Cited

U.S. PATENT DOCUMENTS

| | | | |
|---|---|---|---|
| 8,125,286 B2* | 2/2012 | Huang | H03K 5/133 331/1 A |
| 2002/0169994 A1 | 11/2002 | Yang | |
| 2005/0232386 A1* | 10/2005 | Mitsumoto | H03L 7/0816 375/376 |
| 2006/0097767 A1* | 5/2006 | Lu | G06F 1/06 327/291 |
| 2006/0242448 A1* | 10/2006 | Minzoni | G06F 1/10 713/503 |
| 2008/0252343 A1* | 10/2008 | Yamane | H03L 7/0814 327/158 |
| 2009/0179708 A1* | 7/2009 | Tamura | H03L 7/0995 331/34 |
| 2012/0146603 A1 | 6/2012 | Lee et al. | |
| 2014/0039823 A1* | 2/2014 | Raghupathy | G01S 5/14 702/94 |
| 2015/0109621 A1* | 4/2015 | Huber | G01B 9/02043 356/479 |

FOREIGN PATENT DOCUMENTS

| | | | | |
|---|---|---|---|---|
| JP | 2004062578 A | * | 2/2004 | |
| WO | WO-9914759 A1 | * | 3/1999 | G06F 1/10 |
| WO | WO-0165682 A2 | * | 9/2001 | H03C 5/00 |
| WO | WO-2021210504 A1 | * | 10/2021 | H03L 7/081 |

OTHER PUBLICATIONS

Written Opinion of the International Searching Authority for PCT/JP2021/015001 (PCT/ISA/210) dated Jun. 29, 2021.

Yang et al., "A One-Wire Approach for Skew-Compensating Clock Distribution Based on Bidirectional Techniques", IEEE Journal of Solid-State Circuits, vol. 36, No. 2, pp. 266-272, Feb. 2001.

Indian Office Action for Indian Application No. 202247052869, dated Nov. 30, 2022, with English translation.

* cited by examiner

DELAY SYNCHRONIZATION CIRCUIT, CLOCK TRANSMISSION CIRCUIT, AND CLOCK TRANSMISSION AND RECEPTION CIRCUIT

CROSS REFERENCE TO RELATED APPLICATIONS

This application is a Continuation of PCT International Application No. PCT/JP2021/015001, filed on Apr. 9, 2021, which claims priority under 35 U.S.C. 119(a) to Patent Application No. PCT/JP2020/016543, filed in Japan on Apr. 15, 2020, all of which are hereby expressly incorporated by reference into the present application.

TECHNICAL FIELD

The present disclosure relates to a delay synchronization circuit, a clock transmission circuit including the delay synchronization circuit, and a clock transmission and reception circuit including the delay synchronization circuit.

BACKGROUND ART

The clock transmission circuit typically distributes a clock signal to a plurality of circuit blocks in a system. In a case where jitter is superimposed on the clock signal distributed from the clock transmission circuit, synchronization accuracy in the system may be degraded. The superimposition of the jitter on the clock signal may occur due to the influence of disturbance. As the disturbance, noise or the like superimposed on a cable used to distribute the clock signal is assumed.

In order to suppress disturbance, the clock transmission circuit may include, for example, a delay synchronization circuit as disclosed in Non-Patent Literature 1 below.

The delay synchronization circuit disclosed in Non-Patent Literature 1 includes a first signal delay circuit (hereinafter referred to as "VCDL") that delays a reference signal that is a clock signal. In addition, the delay synchronization circuit includes a circulator that outputs the reference signal delayed by the first VCDL to a clock reception circuit via a cable and then outputs the reference signal returned from the clock reception circuit as a feedback signal, and a second VCDL that delays the feedback signal output from the circulator.

The delay synchronization circuit also includes a delay-amount control circuit that controls the delay amount of the reference signal in the first VCDL and the delay amount of the feedback signal in the second VCDL on the basis of the phase difference between the reference signal applied to the first VCDL and the feedback signal delayed by the second VCDL.

CITATION LIST

Non-Patent Literatures

Non-Patent Literature 1: Ching-Yuan Yang, and Shen-Iuan Liu, "A One-Wire Approach for Skew-Compensating Clock Distribution Based on Bidirectional Techniques", IEEE Journal of Solid-State Circuits, vol. 36, no. 2, pp. 266-272, February 2001

SUMMARY OF INVENTION

Technical Problem

It is rare that variable delay characteristics in the first VCDL and variable delay characteristics in the second VCDL completely match. The conventional delay synchronization circuit described above has a problem that the larger the difference between the variable delay characteristics in the first VCDL and the variable delay characteristics in the second VCDL, the lower the amount of suppression of disturbance.

The present disclosure has been made to solve the above problem, and an object of the present disclosure is to obtain a delay synchronization circuit capable of preventing a reduction in the amount of suppression of disturbance due to the difference in variable delay characteristics between two VCDLs.

Solution to Problem

A delay synchronization circuit according to the present disclosure includes a pulse synthesizing circuit to generate a synthesized signal including a first pulse signal synchronized with a reference signal and a second pulse signal synchronized with a feedback signal, a signal delay circuit to delay a synthesized signal generated by the pulse synthesizing circuit and output a delay signal that is a delayed synthesized signal, a pulse separation circuit to generate a first separation signal synchronized with a first pulse signal included in a delay signal output from the signal delay circuit and generate a second separation signal synchronized with a second pulse signal included in the delay signal, a circulator to output a first separation signal generated by the pulse separation circuit to a clock reception circuit and then output the first separation signal returned from the clock reception circuit to the pulse synthesizing circuit as the feedback signal, and a delay-amount control circuit to control a delay amount of a synthesized signal in the signal delay circuit in accordance with a phase difference between the reference signal and a second separation signal generated by the pulse separation circuit.

Advantageous Effects of Invention

According to the present disclosure, it is possible to prevent a reduction in the amount of suppression of disturbance due to the difference in variable delay characteristics between two signal delay circuits.

BRIEF DESCRIPTION OF DRAWINGS

FIG. 7 is an explanatory diagram illustrating a phase difference signal indicating a phase difference after offset and a phase difference signal output from a PD core 35a.

DESCRIPTION OF EMBODIMENTS

Hereinafter, in order to describe the present disclosure in more detail, embodiments for carrying out the present disclosure will be described with reference to the accompanying drawings.

First Embodiment

Figure 1:
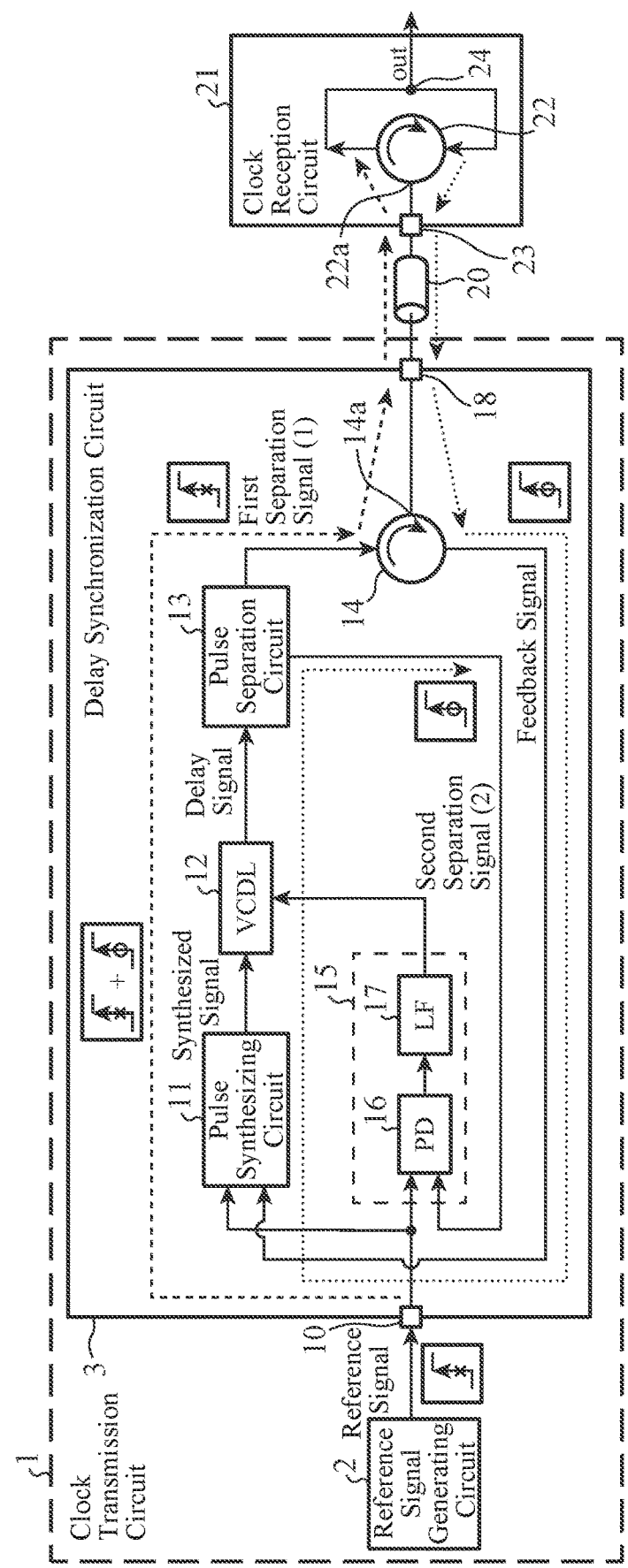
FIG. 1 is a configuration diagram illustrating a clock transmission and reception circuit according to a first embodiment.

FIG. 1 is a configuration diagram illustrating a clock transmission and reception circuit according to a first embodiment.

The clock transmission and reception circuit illustrated in FIG. 1 includes a clock transmission circuit 1 and a clock reception circuit 21.

The clock transmission circuit 1 includes a reference signal generating circuit 2 and a delay synchronization circuit 3.

The reference signal generating circuit 2 generates a clock signal and outputs the clock signal to the delay synchronization circuit 3 as a reference signal.

The delay synchronization circuit 3 includes an input terminal 10, a pulse synthesizing circuit 11, a signal delay circuit (hereinafter, referred to as "Voltage-Controlled Delay-Line (VCDL)") 12, a pulse separation circuit 13, a circulator 14, a delay-amount control circuit 15, and an input and output terminal 18.

The input terminal 10 is a terminal to which the reference signal output from the reference signal generating circuit 2 is applied.

The pulse synthesizing circuit 11 generates a synthesized signal including a first pulse signal (1) synchronized with the reference signal output from the reference signal generating circuit 2 and a second pulse signal (2) synchronized with a feedback signal output from the circulator 14.

The pulse synthesizing circuit 11 outputs the synthesized signal to the VCDL 12.

The VCDL 12 delays the synthesized signal generated by the pulse synthesizing circuit 11, and outputs a delay signal, which is a delayed synthesized signal, to the pulse separation circuit 13. The delay amount of the synthesized signal in the VCDL 12 is controlled by a delay control voltage output from the delay-amount control circuit 15.

The pulse separation circuit 13 generates a first separation signal (1) synchronized with the first pulse signal (1) included in the delay signal output from the VCDL 12.

The pulse separation circuit 13 generates a second separation signal (2) synchronized with the second pulse signal (2) included in the delay signal output from the VCDL 12.

The pulse separation circuit 13 outputs the first separation signal (1) to the circulator 14, and the second separation signal (2) to the delay-amount control circuit 15.

The circulator 14 outputs the first separation signal (1) output from the pulse separation circuit 13 to the clock reception circuit 21 to be described later via a cable 20 to be described later.

After outputting the first separation signal (1), the circulator 14 outputs the first separation signal (1) returned from the clock reception circuit 21 to the pulse synthesizing circuit 11 as a feedback signal.

The delay-amount control circuit 15 includes a phase detector (hereinafter, referred to as "PD") 16 and a loop filter (hereinafter, referred to as "LF") 17.

The delay-amount control circuit 15 controls the delay amount of the synthesized signal in the VCDL 12 in accordance with the phase difference between the reference signal output from the reference signal generating circuit 2 and the second separation signal (2) generated by the pulse separation circuit 13.

The PD 16 detects the phase difference between the reference signal output from the reference signal generating circuit 2 and the second separation signal (2) generated by the pulse separation circuit 13, and outputs a phase difference signal indicating the phase difference to the LF 17.

The LF 17 smooths the phase difference signal output from the PD 16 and generates a delay control voltage in the VCDL 12 on the basis of the smoothed phase difference signal.

The LF 17 controls the delay amount of the synthesized signal in the VCDL 12 by outputting the generated delay control voltage to the VCDL 12.

The input and output terminal 18 is connected to an input and output terminal 14a of the circulator 14 and one end of the cable 20.

One end of the cable 20 is connected to the input and output terminal 18.

The other end of the cable 20 is connected to an input and output terminal 23 of the clock reception circuit 21.

The clock reception circuit 21 includes a circulator 22, the input and output terminal 23, and an output point 24.

The clock reception circuit 21 receives the first separation signal (1) output from the circulator 14 of the clock transmission circuit 1, and outputs the first separation signal (1) from the output point 24 to the outside of the circuit as a clock signal.

In addition, the clock reception circuit 21 outputs the received first separation signal (1) to the circulator 14 of the clock transmission circuit 1 via the cable 20.

The circulator 22 receives the first separation signal (1) output from the circulator 14 of the clock transmission circuit 1, and outputs the first separation signal (1) to the outside of the circuit from the output point 24 as a clock signal.

In addition, the circulator 22 outputs the received first separation signal (1) to the circulator 14 of the clock transmission circuit 1 via the cable 20.

The input and output terminal 23 is connected to the other end of the cable 20 and an input and output terminal 22a of the circulator 22.

The output point 24 is an output point for the clock reception circuit 21 to output the first separation signal (1) to the outside of the circuit as a clock signal.

Next, an operation of the clock transmission circuit 1 illustrated in FIG. 1 will be described.

The reference signal generating circuit 2 generates a clock signal and outputs the clock signal to the delay synchronization circuit 3 as a reference signal.

The reference signal output from the reference signal generating circuit 2 to the delay synchronization circuit 3 is applied to each of the pulse synthesizing circuit 11 and the PD 16 of the delay-amount control circuit 15.

The pulse synthesizing circuit 11 acquires the reference signal output from the reference signal generating circuit 2 and also acquires the feedback signal output from the circulator 14.

The pulse synthesizing circuit 11 generates a synthesized signal including the first pulse signal (1) synchronized with the reference signal and the second pulse signal (2) synchronized with the feedback signal.

Figure 2:
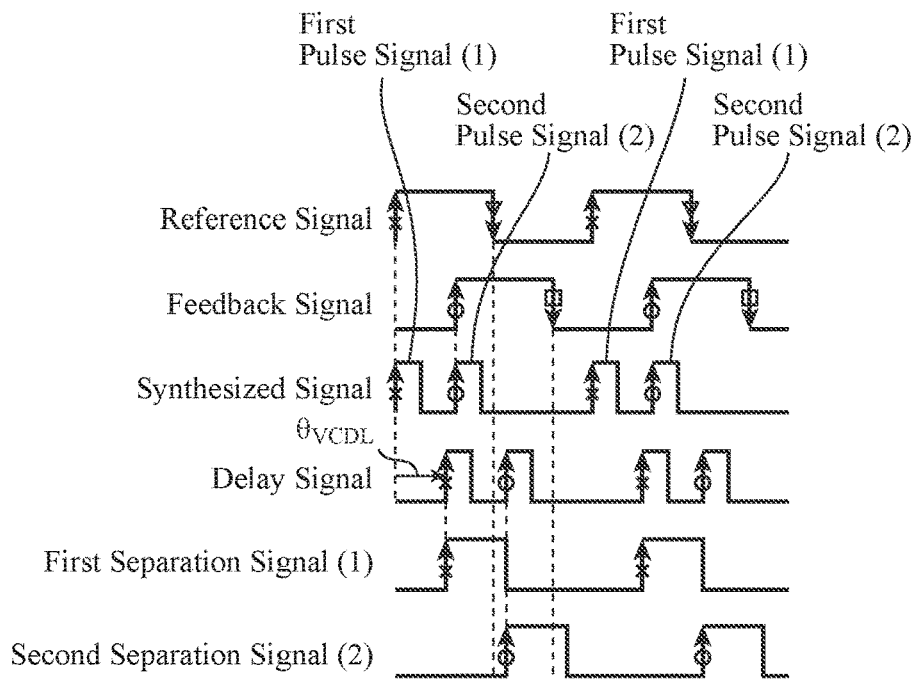
FIG. 2 is an explanatory diagram illustrating waveforms of various signals generated by a delay synchronization circuit 3.

For example, as illustrated in FIG. 2, the first pulse signal (1) is a pulse signal rising at the same timing as the reference signal.

For example, as illustrated in FIG. 2, the second pulse signal (2) is a pulse signal rising at the same timing as the feedback signal.

FIG. 2 is an explanatory diagram illustrating waveforms of various signals generated by the delay synchronization circuit 3.

The pulse synthesizing circuit 11 outputs the synthesized signal to the VCDL 12.

The rising timings of the reference signal and the first pulse signal (1) and the rising timings of the feedback signal and the second pulse signal (2) are not each limited to exactly the same timing, and include timings shifted within a practically acceptable range.

In the clock transmission circuit 1 illustrated in FIG. 1, the pulse synthesizing circuit 11 generates the first pulse signal (1) rising at the same timing as the reference signal and the second pulse signal (2) rising at the same timing as the feedback signal. However, this is only an example, and the pulse synthesizing circuit 11 may generate, for example, the first pulse signal (1) falling at the same timing as the reference signal and the second pulse signal (2) falling at the same timing as the feedback signal.

When receiving the synthesized signal from the pulse synthesizing circuit 11, the VCDL 12 delays the synthesized signal and outputs the delay signal, which is a delayed synthesized signal, to the pulse separation circuit 13 as illustrated in FIG. 2.

In the example of FIG. 2, the VCDL 12 delays the phase of the synthesized signal by $\theta_{VCDL}$.

When receiving the delay signal from the VCDL 12, the pulse separation circuit 13 generates the first separation signal (1) synchronized with the first pulse signal (1) included in the delay signal, as illustrated in FIG. 2. The timing of the rising edge of the first separation signal (1) generated by the pulse separation circuit 13 is the same as the timing of the rising edge of the first pulse signal (1).

As illustrated in FIG. 2, the pulse separation circuit 13 generates the first separation signal (2) synchronized with the second pulse signal (2) included in the delay signal. The timing of the rising edge of the second separation signal (2) generated by the pulse separation circuit 13 is the same as the timing of the rising edge of the second pulse signal (2).

The pulse separation circuit 13 outputs the first separation signal (1) to the circulator 14 and the second separation signal (2) to the PD 16 of the delay-amount control circuit 15.

The rising timings of the first pulse signal (1) and the first separation signal (1) and the rising timings of the second pulse signal (2) and the second separation signal (2) are not each limited to exactly the same timing, and include timings shifted within a practically acceptable range.

When receiving the first separation signal (1) from the pulse separation circuit 13, the circulator 14 outputs the first separation signal (1) from the input and output terminal 14a to the clock reception circuit 21 via the cable 20.

The circulator 22 of the clock reception circuit 21 receives the first separation signal (1) output from the circulator 14 of the clock transmission circuit 1.

The first separation signal (1) received by the circulator 22 is output from the output point 24 to the outside of the circuit as a clock signal.

In addition, the circulator 22 outputs the received first separation signal (1) to the circulator 14 of the clock transmission circuit 1 via the cable 20.

The circulator 14 of the clock transmission circuit 1 receives the first separation signal (1) output from the clock reception circuit 21 as a feedback signal, and outputs the feedback signal to the pulse synthesizing circuit 11.

The PD 16 of the delay-amount control circuit 15 acquires the reference signal output from the reference signal generating circuit 2, and also acquires the second separation signal (2) output from the pulse separation circuit 13.

The PD 16 detects the phase difference between the reference signal and the second separation signal (2), and outputs a phase difference signal indicating the phase difference to the LF 17.

The LF 17 smooths the phase difference signal output from the PD 16.

The LF 17 generates a delay control voltage in the VCDL 12 on the basis of the smoothed phase difference signal. The delay control voltage generated by the LF 17 is a control voltage at which the phase difference between the reference signal and the second separation signal (2) is minimized.

The LF 17 controls the delay amount of the synthesized signal in the VCDL 12 by outputting the generated delay control voltage to the VCDL 12.

As the phase difference between the reference signal and the second separation signal (2) is minimized, that is, the phase difference becomes substantially zero, the delay synchronization circuit 3 is locked. By the delay synchronization circuit 3 being locked, disturbance is suppressed.

In the delay synchronization circuit disclosed in Non-Patent Literature 1, variable delay characteristics in the first VCDL may not match variable delay characteristics in the second VCDL. If these delay variable characteristics do not match, the disturbance may not be suppressed even if the delay-amount control circuit controls the delay amount of the reference signal in the first VCDL and the delay amount of the feedback signal in the second VCDL on the basis of the phase difference between the reference signal and the delayed feedback signal.

Figure 3:
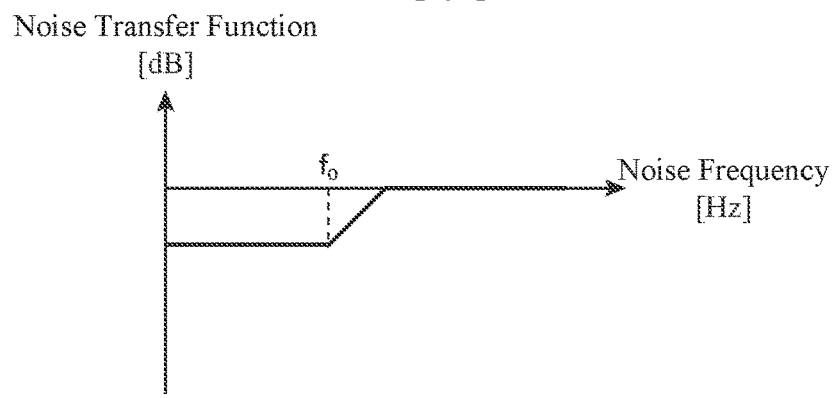
FIG. 3 is an explanatory diagram illustrating a noise transfer function related to a delay synchronization circuit disclosed in Non-Patent Literature 1.

That is, in the delay synchronization circuit disclosed in Non-Patent Literature 1, as illustrated in FIG. 3, the noise transfer function from a noise generation source to a clock reception circuit is not a high-pass filter (HPF) transfer function. As a result, the noise transfer function is flat at a noise frequency lower than $f_0$, and the amount of suppression of the noise at a frequency lower than $f_0$ is limited.

FIG. 3 is an explanatory diagram illustrating a noise transfer function related to the delay synchronization circuit disclosed in Non-Patent Literature 1.

Since the delay synchronization circuit 3 illustrated in FIG. 1 includes only one VCDL 12 as a VCDL, the difference in variable delay characteristics between two VCDLs does not affect the suppression of the disturbance.

Figure 4:
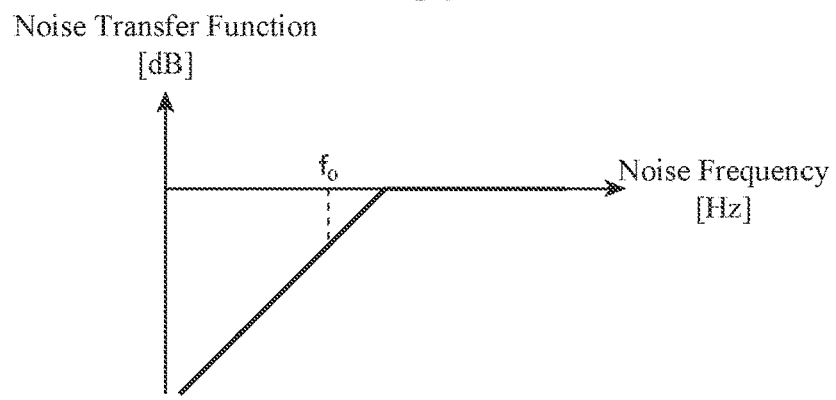
FIG. 4 is an explanatory diagram illustrating a noise transfer function related to the delay synchronization circuit 3 illustrated in FIG. 1.

FIG. 4 is an explanatory diagram illustrating a noise transfer function related to the delay synchronization circuit 3 illustrated in FIG. 1.

In the delay synchronization circuit 3 illustrated in FIG. 1, as illustrated in FIG. 4, the noise transfer function from the noise generation source to the clock reception circuit is an HPF transfer function. As a result, in the delay synchronization circuit 3 illustrated in FIG. 1, the amount of suppression of noise with a frequency lower than $f_0$ is larger than that of the delay synchronization circuit disclosed in Non-Patent Literature 1.

In the first embodiment, the delay synchronization circuit 3 is configured to include the pulse synthesizing circuit 11 that generates the synthesized signal including the first pulse signal synchronized with the reference signal and the second pulse signal synchronized with the feedback signal, the VCDL 12 that delays the synthesized signal generated by the pulse synthesizing circuit 11 and outputs the delay signal, which is a synthesized signal delayed, the pulse separation circuit 13 that generates the first separation signal synchronized with the first pulse signal included in the delay signal output from the VCDL 12 and also generates the second separation signal synchronized with the second pulse signal included in the delay signal, the circulator 14 that outputs the first separation signal generated by the pulse separation circuit 13 to the clock reception circuit 21 and then outputs the first separation signal returned from the clock reception circuit 21 to the pulse synthesizing circuit 11 as a feedback signal, and the delay-amount control circuit 15 that controls the delay amount of the synthesized signal in the VCDL 12 in accordance with the phase difference between the reference signal and the second separation signal generated by the pulse separation circuit 13. Therefore, the delay synchronization circuit 3 can prevent a reduction in the amount of suppression of disturbance due to the difference in delay variable characteristics between two VCDLs.

Second Embodiment

In a second embodiment, a delay synchronization circuit 3 including an offset control circuit 31 will be described.

Figure 5:
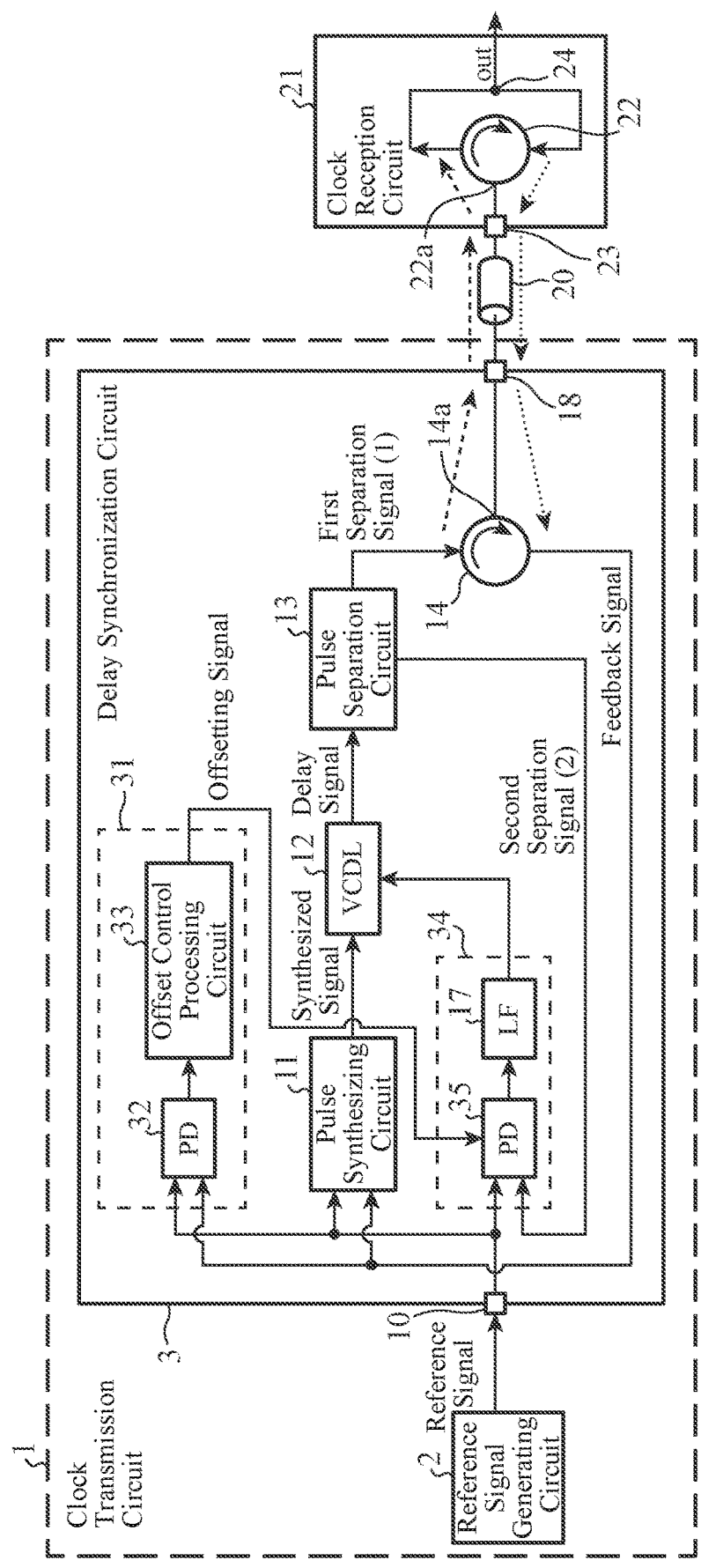
FIG. 5 is a configuration diagram illustrating a clock transmission and reception circuit according to a second embodiment.

FIG. 5 is a configuration diagram illustrating a clock transmission and reception circuit according to the second embodiment. In FIG. 5, the same reference numerals as those in FIG. 1 denote the same or corresponding parts, and thus description thereof is omitted.

The offset control circuit 31 includes a PD 32 and an offset control processing circuit 33.

When the phase difference between a reference signal output from the reference signal generating circuit 2 and a feedback signal output from the circulator 14 is equal to or less than a threshold Th, the offset control circuit 31 outputs an offsetting signal issuing an instruction to give an offset to the PD 35 of a delay-amount control circuit 34.

The PD 32 detects the phase difference between the reference signal output from the reference signal generating circuit 2 and the feedback signal output from the circulator 14, and outputs a phase difference signal indicating the phase difference to the offset control processing circuit 33.

When the phase difference indicated by the phase difference signal output from the PD 32 is equal to or less than the threshold Th, the offset control processing circuit 33 outputs an offsetting signal issuing an instruction to give an offset to the PD 35.

The threshold Th may be stored in an internal memory of the offset control processing circuit 33 or may be provided from the outside of the delay synchronization circuit 3.

The delay-amount control circuit 34 includes the PD 35 and the LF 17.

The delay-amount control circuit 34 detects the phase difference between the reference signal output from the reference signal generating circuit 2 and the second separation signal (2) generated by the pulse separation circuit 13.

When the offsetting signal is output from the offset control circuit 31, the delay-amount control circuit 34 offsets the detected phase difference, and controls the delay amount of the synthesized signal in the VCDL 12 in accordance with the phase difference after the offset.

When the offsetting signal is not output from the offset control circuit 31, the delay-amount control circuit 34 controls the delay amount of the synthesized signal in the VCDL 12 in accordance with the detected phase difference.

Figure 6:
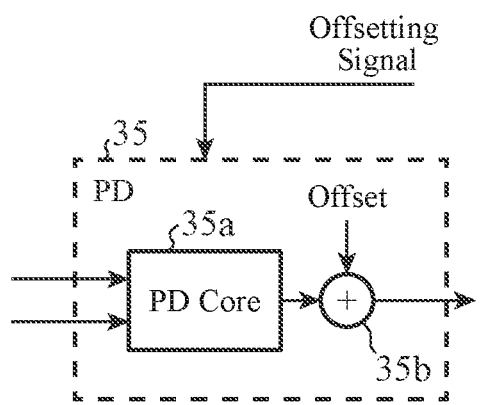
FIG. 6 is a configuration diagram illustrating an internal configuration of a PD 35 illustrated in FIG. 5.

FIG. 6 is a configuration diagram illustrating an internal configuration of the PD 35 illustrated in FIG. 5.

The PD 35 includes the PD core 35a and an adder 35b.

The PD core 35a detects the phase difference between the reference signal output from the reference signal generating circuit 2 and the second separation signal (2) generated by the pulse separation circuit 13, and outputs a phase difference signal indicating the phase difference to the adder 35b.

When the offsetting signal is output from the offset control circuit 31, the adder 35b offsets the detected phase difference indicated by the phase difference signal output from the PD core 35a, and outputs a phase difference signal indicating the phase difference after the offset to the LF 17.

When the offsetting signal is not output from the offset control circuit 31, the adder 35b outputs the phase difference signal output from the PD core 35a to the LF 17.

Next, an operation of the delay synchronization circuit 3 illustrated in FIG. 5 will be described. Since the delay synchronization circuit 3 illustrated in FIG. 5 is similar to the delay synchronization circuit 3 illustrated in FIG. 1 except for the offset control circuit 31 and the delay-amount control circuit 34, operations of the offset control circuit 31 and the delay-amount control circuit 34 will be mainly described here.

The phase difference between the reference signal and the feedback signal after the delay synchronization circuit 3 is locked depends on the delay amount of the first separation signal (1) through the cable 20.

The synthesized signal generated by the pulse synthesizing circuit 11 is a signal including the first pulse signal (1) synchronized with the reference signal and the second pulse signal (2) synchronized with the feedback signal. However, depending on the phase difference between the reference signal and the feedback signal, it may be difficult for the pulse synthesizing circuit 11 to generate a synthesized signal including both the first pulse signal (1) and the second pulse signal (2).

That is, when the phase difference between the reference signal and the feedback signal approaches zero, it may be difficult to generate a synthesized signal including the first pulse signal (1) rising at the same timing as the reference signal and the second pulse signal (2) rising at the same timing as the feedback signal. When the phase difference between the reference signal and the feedback signal approaches zero, the rising edge of the reference signal and the rising edge of the feedback signal are generated substantially simultaneously, so that the interval between the rising edge of the first pulse signal (1) and the rising edge of the feedback signal may be shorter than the pulse width of the first pulse signal (1). In a case where the interval is shorter than the pulse width of the first pulse signal (1), the first pulse signal (1) and the second pulse signal (2) overlap each other, and thus it is difficult for the pulse synthesizing circuit 11 to generate a synthesized signal including both the first pulse signal (1) and the second pulse signal (2).

In the delay synchronization circuit 3 illustrated in FIG. 5, the pulse synthesizing circuit 11 offsets the phase difference between the reference signal and the feedback signal in order to enable the generation of the synthesized signal including both the first pulse signal (1) and the second pulse signal (2) even when the phase difference between the reference signal and the feedback signal is close to zero.

Specifically, it is as follows.

The PD 32 of the offset control circuit 31 detects the phase difference between the reference signal output from the reference signal generating circuit 2 and the feedback signal output from the circulator 14.

The PD 32 outputs a phase difference signal indicating the detected phase difference to the offset control processing circuit 33.

The offset control processing circuit 33 compares the phase difference indicated by the phase difference signal output from the PD 32 with the threshold Th. The threshold Th is, for example, the same value as the pulse width of the first pulse signal (1).

When the phase difference is equal to or less than the threshold Th, the first pulse signal (1) and the second pulse signal (2) overlap each other, and thus the offset control processing circuit 33 outputs an offsetting signal issuing an instruction to give an offset to the PD 35.

When the phase difference is larger than the threshold Th, the first pulse signal (1) and the second pulse signal (2) do not overlap each other, and thus the offset control processing circuit 33 does not output the offsetting signal issuing an instruction to give an offset to the PD 35.

The PD core 35a of the PD 35 detects the phase difference between the reference signal output from the reference signal generating circuit 2 and the second separation signal (2) generated by the pulse separation circuit 13.

The PD core 35a outputs a phase difference signal indicating the detected phase difference to the adder 35b.

Figure 7:
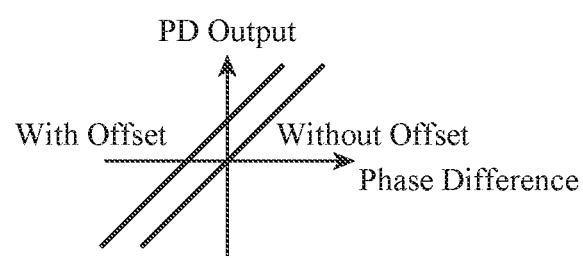

When the offsetting signal is output from the offset control circuit 31, the adder 35b offsets the phase difference indicated by the phase difference signal output from the PD core 35a, and outputs a phase difference signal indicating the phase difference after the offset to the LF 17, as illustrated in FIG. 7. The offset is, for example, a value larger than the pulse width of the first pulse signal (1). Note that the offset is not limited to a value larger than the pulse width of the first pulse signal (1).

As illustrated in FIG. 7, when the offsetting signal is not output from the offset control circuit 31, the adder 35b outputs the phase difference signal output from the PD core 35a to the LF 17.

FIG. 7 is an explanatory diagram illustrating a phase difference signal indicating a phase difference after offset and a phase difference signal output from the PD core 35a.

The LF 17 smooths the phase difference signal output from the adder 35b.

The LF 17 generates a delay control voltage in the VCDL 12 on the basis of the smoothed phase difference signal.

In a case where the offsetting signal is output from the offset control circuit 31, the delay control voltage generated by the LF 17 is a control voltage at which the phase difference between the reference signal and the second separation signal (2) is offset. In a case where the offsetting signal is not output from the offset control circuit 31, the delay control voltage generated by the LF 17 is a control voltage at which the phase difference between the reference signal and the second separation signal (2) is minimized.

The LF 17 controls the delay amount of the synthesized signal in the VCDL 12 by outputting the generated delay control voltage to the VCDL 12.

By the adder 35b offsetting the phase difference indicated by the phase difference signal output from the PD core 35a, the phase difference between the reference signal and the feedback signal after the delay synchronization circuit 3 is locked becomes a value corresponding to the offset. Regardless of the magnitude of the delay amount of the first separation signal (1) through the cable 20, the pulse synthesizing circuit 11 can generate a synthesized signal including both the first pulse signal (1) and the second pulse signal (2).

Note that the phase of the clock signal output from the output point 24 of the clock reception circuit 21 is shifted by a value corresponding to the offset from the phase of the reference signal after the delay synchronization circuit 3 is locked. The external circuit using the clock signal thus needs to compensate the phase of the clock signal by a value corresponding to the offset.

In the second embodiment, the delay synchronization circuit 3 illustrated in FIG. 5 is configured to include the offset control circuit 31 that outputs the offsetting signal issuing the instruction to give an offset when the phase difference between the reference signal and the feedback signal is equal to or less than a threshold, and is also configured in such a way that when the offsetting signal is output from the offset control circuit 31, the delay-amount control circuit 34 offsets the phase difference between the reference signal and the second separation signal (2), and controls the delay amount of the synthesized signal in the VCDL 12 in accordance with the phase difference after the offset. As a result, similarly to the delay synchronization circuit 3 illustrated in FIG. 1, the delay synchronization circuit 3 illustrated in FIG. 5 can prevent a reduction in the amount of suppression of disturbance due to the difference in delay variable characteristics between two VCDLs. In addition, regardless of the magnitude of the delay amount of the first separation signal (1) through the cable 20, the delay synchronization circuit 3 illustrated in FIG. 5 can generate a synthesized signal including both the first pulse signal (1) and the second pulse signal (2).

Third Embodiment

In a third embodiment, a delay synchronization circuit 3 including a first phase shifter 41, a second phase shifter 42, a third phase shifter 43, a fourth phase shifter 44, a fifth phase shifter 45, a sixth phase shifter 46, and a phase-shift-amount control circuit 47 will be described.

Figure 8:
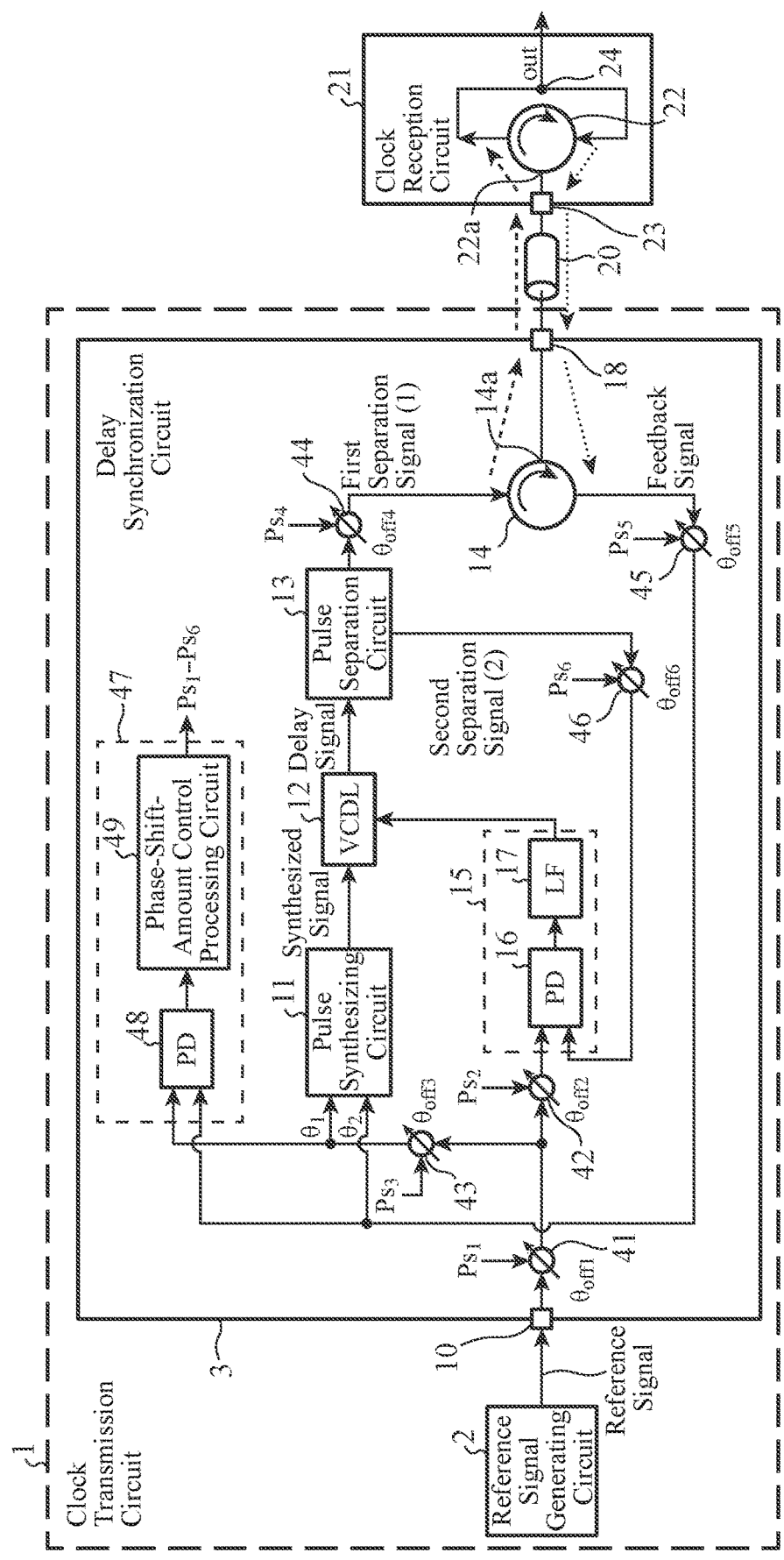
FIG. 8 is a configuration diagram illustrating a clock transmission and reception circuit according to a third embodiment.

FIG. 8 is a configuration diagram illustrating a clock transmission and reception circuit according to the third embodiment. In FIG. 8, the same reference numerals as those in FIGS. 1 and 5 denote the same or corresponding parts, and thus description thereof is omitted.

The first phase shifter 41 shifts the phase of a reference signal output from the reference signal generating circuit 2 by a first phase-shift amount $\theta_{off1}$, and outputs the phase-shifted reference signal to each of the second phase shifter 42 and the third phase shifter 43. The first phase-shift amount $\theta_{off1}$ is a phase shift amount indicated by a phase shift signal $Ps_1$ output from the phase-shift-amount control circuit 47.

The second phase shifter 42 shifts the phase of the phase-shifted reference signal output from the first phase shifter 41 by a second phase-shift amount $\theta_{off2}$, and outputs the reference signal phase-shifted by the second phase-shift amount $\theta_{off2}$ to the PD 16 of the delay-amount control circuit 15. The second phase-shift amount $\theta_{off2}$ is a phase shift amount indicated by a phase shift signal $Ps_2$ output from the phase-shift-amount control circuit 47.

The third phase shifter 43 shifts the phase of the phase-shifted reference signal output from the first phase shifter 41 by a third phase-shift amount $\theta_{off3}$, and outputs the reference signal phase-shifted by the third phase-shift amount $\theta_{off3}$ to a PD 48 of the phase-shift-amount control circuit 47. The third phase-shift amount $\theta_{off3}$ is a phase shift amount indicated by a phase shift signal $Ps_3$ output from the phase-shift-amount control circuit 47.

The fourth phase shifter 44 shifts the phase of the first separation signal (1) generated by the pulse separation circuit 13 by a fourth phase-shift amount $\theta_{off4}$, and outputs the phase-shifted first separation signal (1) to the circulator 14. The fourth phase-shift amount $\theta_{off4}$ is a phase shift amount indicated by a phase shift signal $Ps_4$ output from the phase-shift-amount control circuit 47.

The fifth phase shifter 45 shifts the phase of a feedback signal output from the circulator 14 by a fifth phase-shift amount $\theta_{off5}$, and outputs the phase-shifted feedback signal to the PD 48 of the phase-shift-amount control circuit 47. The fifth phase-shift amount $\theta_{off5}$ is a phase shift amount indicated by a phase shift signal $Ps_5$ output from the phase-shift-amount control circuit 47.

The sixth phase shifter 46 shifts the phase of the second separation signal (2) generated by the pulse separation circuit 13 by a sixth phase-shift amount $\theta_{off6}$, and outputs the phase-shifted second separation signal (2) to the PD 16 of the delay-amount control circuit 15. The sixth phase-shift amount $\theta_{off6}$ is a phase shift amount indicated by a phase shift signal $Ps_6$ output from the phase-shift-amount control circuit 47.

The phase-shift-amount control circuit 47 includes the PD 48 and a phase-shift-amount control processing circuit 49.

The phase-shift-amount control circuit 47 detects the phase difference between the reference signal output from the third phase shifter 43 and the feedback signal output from the fifth phase shifter 45.

The phase-shift-amount control circuit 47 compares the detected phase difference with the threshold Th, and controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount Ono, and the sixth phase-shift amount $\theta_{off6}$ on the basis of the result of comparison between the phase difference and the threshold Th.

That is, the phase-shift-amount control circuit 47 outputs a phase shift signal $Ps_n$ indicating an n-th phase-shift amount $\theta_{offn}$ to an n-th phase shifter on the basis of the result of comparison between the phase difference and the threshold Th. n=1, 2, 3, 4, 5, and 6.

The PD 48 detects the phase difference between the reference signal output from the third phase shifter 43 and the feedback signal output from the fifth phase shifter 45, and outputs a phase difference signal indicating the phase difference to the phase-shift-amount control processing circuit 49.

The phase-shift-amount control processing circuit 49 compares the detected phase difference indicated by the phase difference signal output from the PD 48 with the threshold Th, and controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, and the sixth phase-shift amount $\theta_{off6}$ on the basis of the result of comparison between the phase difference and the threshold Th.

The threshold Th may be stored in an internal memory of the phase-shift-amount control processing circuit 49 or may be provided from the outside of the delay synchronization circuit 3.

Next, an operation of the delay synchronization circuit 3 illustrated in FIG. 8 will be described. The delay synchronization circuit 3 illustrated in FIG. 8 is similar to the delay synchronization circuit 3 illustrated in FIG. 1 except for the first phase shifter 41, the second phase shifter 42, the third phase shifter 43, the fourth phase shifter 44, the fifth phase shifter 45, the sixth phase shifter 46, and the phase-shift-amount control circuit 47. Operations of the first phase shifter 41, the second phase shifter 42, the third phase shifter 43, the fourth phase shifter 44, the fifth phase shifter 45, the sixth phase shifter 46, and the phase-shift-amount control circuit 47 will be mainly described here.

The phase difference between the reference signal and the feedback signal after the delay synchronization circuit 3 is locked depends on the delay amount of the first separation signal (1) through the cable 20, as described above.

In the delay synchronization circuit 3 illustrated in FIG. 8, similarly to the delay synchronization circuit 3 illustrated in FIG. 5, the pulse synthesizing circuit 11 offsets the phase difference between the reference signal and the feedback signal in order to enable the generation of the synthesized signal including both the first pulse signal (1) and the second pulse signal (2) even when the phase difference between the reference signal and the feedback signal is close to zero.

Specifically, it is as follows.

When receiving the reference signal from the reference signal generating circuit 2, the first phase shifter 41 shifts the phase of the reference signal by the first phase-shift amount $\theta_{off1}$, and outputs the phase-shifted reference signal to each of the second phase shifter 42 and the third phase shifter 43.

When receiving the phase-shifted reference signal from the first phase shifter 41, the second phase shifter 42 shifts the phase of the phase-shifted reference signal by the second phase-shift amount $\theta_{off2}$, and outputs the reference signal phase-shifted by the second phase-shift amount $\theta_{off2}$ to the PD 16 of the delay-amount control circuit 15.

When receiving the phase-shifted reference signal from the first phase shifter 41, the third phase shifter 43 shifts the phase of the phase-shifted reference signal by the third phase-shift amount $\theta_{off3}$, and outputs the reference signal phase-shifted by the third phase-shift amount $\theta_{off3}$ to the PD 48 of the phase-shift-amount control circuit 47.

When receiving the first separation signal (1) from the pulse separation circuit 13, the fourth phase shifter 44 shifts the phase of the first separation signal (1) by the fourth phase-shift amount $\theta_{off4}$, and outputs the phase-shifted first separation signal (1) to the circulator 14.

When receiving the feedback signal from the circulator 14, the fifth phase shifter 45 shifts the phase of the feedback signal by the fifth phase-shift amount $\theta_{off5}$, and outputs the phase-shifted feedback signal to the PD 48 of the phase-shift-amount control circuit 47.

When receiving the second separation signal (2) from the pulse separation circuit 13, the sixth phase shifter 46 shifts the phase of the second separation signal (2) by the sixth phase-shift amount $\theta_{off6}$, and outputs the phase-shifted second separation signal (2) to the PD 16 of the delay-amount control circuit 15.

The PD 48 of the phase-shift-amount control circuit 47 acquires the reference signal from the third phase shifter 43 and the feedback signal from the fifth phase shifter 45.

The PD 48 detects the phase difference between the reference signal and the feedback signal, and outputs a phase difference signal indicating the phase difference to the phase-shift-amount control processing circuit 49.

The phase-shift-amount control processing circuit 49 compares the phase difference indicated by the phase difference signal output from the PD 48 with the threshold Th.

The phase-shift-amount control processing circuit 49 controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, and the sixth phase-shift amount $\theta_{off6}$ on the basis of the result of comparison between the phase difference and the threshold Th.

That is, the phase-shift-amount control processing circuit 49 outputs the phase shift signal $Ps_1$ indicating the first phase-shift amount $\theta_{off1}$ to the first phase shifter 41, the phase shift signal $Ps_2$ indicating the second phase-shift amount $\theta_{off2}$ to the second phase shifter 42, and the phase shift signal $Ps_1$ indicating the third phase-shift amount $\theta_{off3}$ to the third phase shifter 43.

In addition, the phase-shift-amount control processing circuit 49 outputs the phase shift signal $Ps_4$ indicating the fourth phase-shift amount $\theta_{off4}$ to the fourth phase shifter 44, the phase shift signal $Ps_5$ indicating the fifth phase-shift amount $\theta_{off5}$ to the fifth phase shifter 45, and the phase shift signal $Ps_6$ indicating the sixth phase-shift amount $\theta_{off6}$ to the sixth phase shifter 46.

Since the condition for locking the delay synchronization circuit 3 is that the phase difference between the reference signal and the feedback signal is zero, the phase $\theta_{out}$ of the clock signal output from the output point 24 of the clock reception circuit 21 is represented by the following expression (1) when the delay synchronization circuit 3 is locked.

$$\theta_{out} = \pi \times k + (\theta_{off2} + \theta_{off3} + \theta_{off4} - \theta_{off5} - \theta_{off6})/2 + \theta_{off1} \quad (1)$$

In the expression (1), k is an integer.

Therefore, when the delay synchronization circuit 3 is locked, the phase difference $\theta_2 - \theta_1$ between the phase $\theta_1$ of the reference signal output from the third phase shifter 43 to the pulse synthesizing circuit 11 and the phase $\theta_2$ of the feedback signal output from the fifth phase shifter 45 to the pulse synthesizing circuit 11 is represented by the following expression (2).

$$\theta_2 - \theta_1 = \pi \times k + \theta_{wire} + (\theta_{off2} + \theta_{off4} + \theta_{off5} - \theta_{off3} - \theta_{off6})/2 \quad (2)$$

In the expression (2), $\theta_{wire}$ is a delay phase of the first separation signal (1) through the cable 20.

When no offset is given because the phase difference is larger than the threshold Th, the phase-shift-amount control processing circuit 49 controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, and the sixth phase-shift amount $\theta_{off6}$, as shown by the following expression (3), for example.

$$\theta_{off1} = \theta_{off2} = \theta_{off3} = \theta_{off4} = \theta_{off5} = \theta_{off6} = 0 \quad (3)$$

When an offset is given because the phase difference is equal to or less than the threshold Th, the phase-shift-amount control processing circuit 49 controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, and the sixth phase-shift amount $\theta_{off6}$, as shown by the following expression (4), for example.

$$\theta_{off1} = \theta_{off3} = \theta_{off5} = \theta_{off6} = 0$$

$$\theta_{off2} = \theta_{off4} = \pi \quad (4)$$

When the phase-shift-amount control processing circuit 49 controls the phase shift amount as shown by the expressions (3) and (4), the phase difference between the reference signal and the feedback signal applied to the pulse synthesizing circuit 11 changes by 180 degrees before and after the offset. Furthermore, the phase $\theta_{out}$ of the clock signal output from the output point 24 of the clock reception circuit 21 changes by 180 degrees before and after the offset.

Since the phase $\theta_{out}$ of the clock signal output from the output point 24 of the clock reception circuit 21 changes by 180 degrees before and after the offset, the external circuit using the clock signal needs to perform compensation to invert the phase of the clock signal after the offset by 180 degrees.

Here, the phase-shift-amount control processing circuit 49 controls the phase shift amount as shown by the expressions (3) and (4). However, this is only an example, and when no offset is given, the phase-shift-amount control processing circuit 49 may control the phase shift amount, for example, as shown by the expression (3), and when an offset is given, the phase-shift-amount control processing circuit 49 may control the phase shift amount, for example, as shown by the expression (5) below.

$$\theta_{off1}=\theta_{off3}=\theta_{off5}=\theta_{off6}=0$$

$$\theta_{off2}=\theta_{off4}=\pi/2 \qquad (5)$$

The delay synchronization circuit 3 illustrated in FIG. 8 includes the first phase shifter 41, the second phase shifter 42, the third phase shifter 43, the fourth phase shifter 44, the fifth phase shifter 45, and the sixth phase shifter 46. However, this is only an example, and the delay synchronization circuit 3 may include only some of the first phase shifter 41, the second phase shifter 42, the third phase shifter 43, the fourth phase shifter 44, the fifth phase shifter 45, and the sixth phase shifter 46. For example, the delay synchronization circuit 3 does not need to include a phase shifter in which the phase shift amount is zero before and after the offset.

Fourth Embodiment

In a fourth embodiment, a delay synchronization circuit 3 in which each of the first phase shifter 41, the second phase shifter 42, the third phase shifter 43, the fourth phase shifter 44, the fifth phase shifter 45, and the sixth phase shifter 46 includes a first inverter 51 and a first multiplexer 52 will be described.

The configuration of the delay synchronization circuit 3 according to the fourth embodiment is similar to the configuration of the delay synchronization circuit 3 according to the third embodiment, and FIG. 8 is a configuration diagram illustrating the delay synchronization circuit 3 according to the fourth embodiment.

Figure 9:
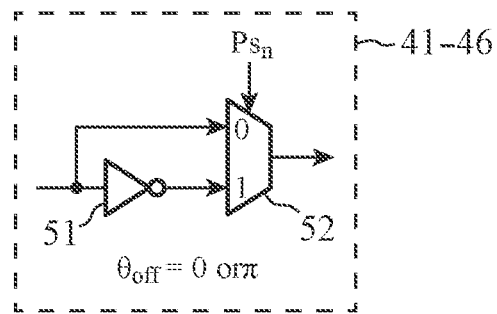
FIG. 9 is a configuration diagram illustrating the inside of each of a first phase shifter 41, a second phase shifter 42, a third phase shifter 43, a fourth phase shifter 44, a fifth phase shifter 45, and a sixth phase shifter 46 in a delay synchronization circuit 3 according to a fourth embodiment.

FIG. 9 is a configuration diagram illustrating the inside of each of the first phase shifter 41, the second phase shifter 42, the third phase shifter 43, the fourth phase shifter 44, the fifth phase shifter 45, and the sixth phase shifter 46 in the delay synchronization circuit 3 according to the fourth embodiment.

The first inverter 51 inverts an input signal and outputs the inverted signal to the first multiplexer 52.

In the case of the first phase shifter 41, the input signal is a reference signal output from the reference signal generating circuit 2, and in the case of the second phase shifter 42, the input signal is a reference signal phase-shifted by the first phase shifter 41.

In the case of the third phase shifter 43, the input signal is the reference signal phase-shifted by the first phase shifter 41, and in the case of the fourth phase shifter 44, the input signal is the first pulse separation signal (1) output from the pulse separation circuit 13.

In the case of the fifth phase shifter 45, the input signal is a feedback signal output from the circulator 14, and in the case of the sixth phase shifter 46, the input signal is the second pulse separation signal (2) output from the pulse separation circuit 13.

The first multiplexer 52 of an n-th phase shifter (n=1, 2, 3, 4, 5, and 6) selects one of the input signal and the inverted signal output from the first inverter 51 on the basis of a phase shift amount $\theta_{offn}$ controlled by the phase-shift-amount control circuit 47, and outputs the selected signal.

The phase difference between the phase of the input signal and the phase of the inverted signal output from the first inverter 51 is 180 degrees.

When causing the first multiplexer 52 of the n-th phase shifter to select the input signal, the phase-shift-amount control circuit 47 outputs a phase shift signal $Ps_n$ indicating the phase shift amount $\theta_{offn}=0$ to the first multiplexer 52 of the n-th phase shifter.

When causing the first multiplexer 52 of the n-th phase shifter to select the inverted signal output from the first inverter 51, the phase-shift-amount control circuit 47 outputs a phase shift signal $Ps_n$ indicating the phase shift amount $\theta_{offn}=180$ to the first multiplexer 52 of the n-th phase shifter.

In the delay synchronization circuit 3 according to the fourth embodiment, the phase shift amount that can be obtained by each of the first phase shifter 41, the second phase shifter 42, the third phase shifter 43, the fourth phase shifter 44, the fifth phase shifter 45, and the sixth phase shifter 46 is limited to 0 or 180.

In the fourth embodiment, the delay synchronization circuit 3 is configured so that each of the first phase shifter 41, the second phase shifter 42, the third phase shifter 43, the fourth phase shifter 44, the fifth phase shifter 45, and the sixth phase shifter 46 includes the first inverter 51 that inverts an input signal and outputs an inverted signal, and the first multiplexer 52 that selects one of the input signal and the inverted signal output from the first inverter 51 on the basis of the phase shift amount controlled by the phase-shift-amount control circuit 47 and outputs the selected signal. As a result, similarly to the delay synchronization circuit 3 illustrated in FIG. 8, regardless of the magnitude of the delay amount of the first separation signal (1) through the cable 20, the delay synchronization circuit 3 according to the fourth embodiment can generate a synthesized signal including both the first pulse signal (1) and the second pulse signal (2). In addition, in the delay synchronization circuit 3 according to the fourth embodiment, the configuration of the n-th phase shifter (n=1, 2, 3, 4, 5, and 6) can be simplified as compared with, for example, a phase shifter capable of obtaining a phase shift amount of 0 to 360.

Fifth Embodiment

In a fifth embodiment, a delay synchronization circuit 3 including a first divide-by-two frequency divider 61, a seventh phase shifter 62, a second divide-by-two frequency divider 63, an eighth phase shifter 64, and a phase-shift-amount control circuit 65 will be described.

Figure 10:
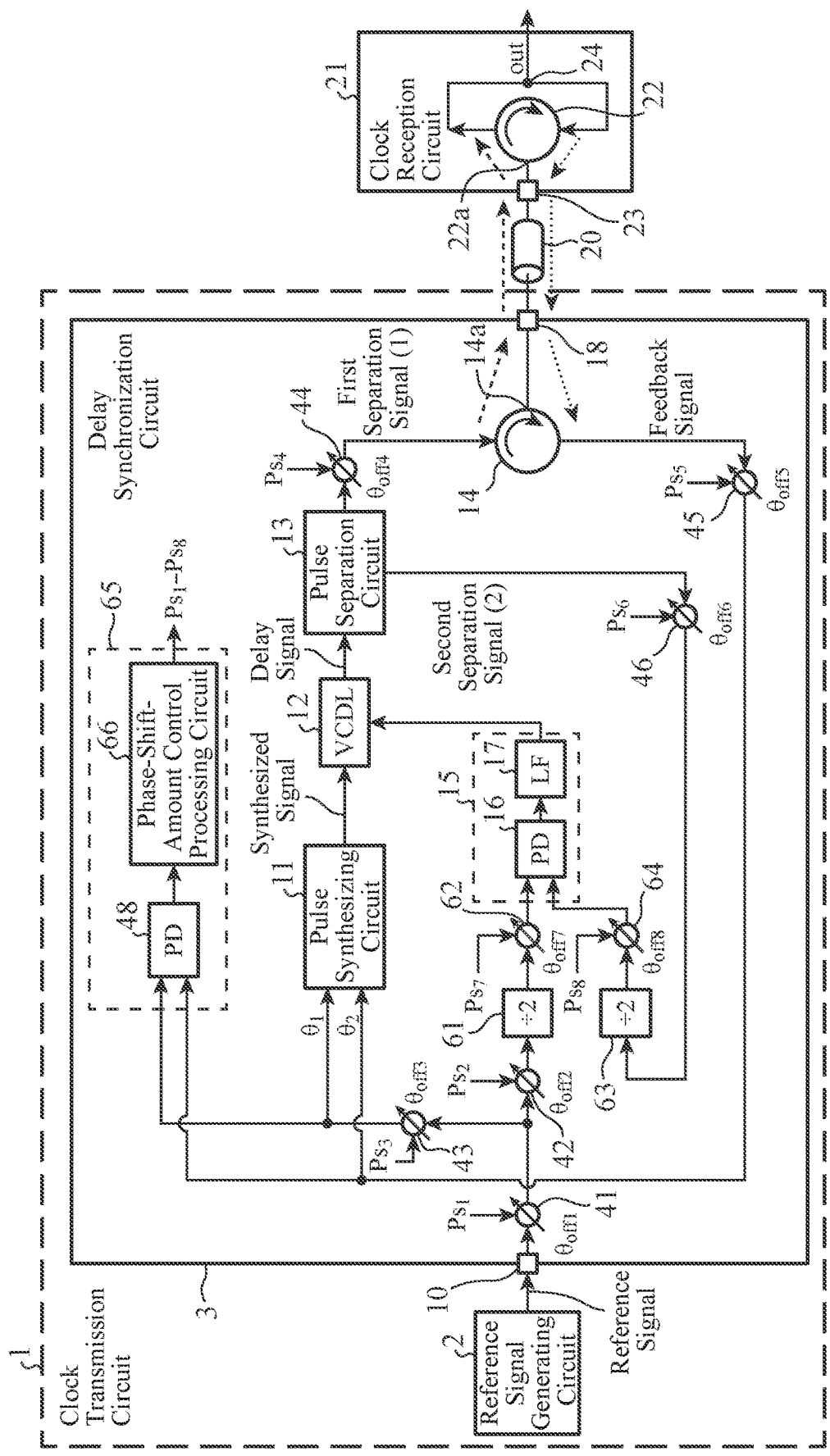
FIG. 10 is a configuration diagram illustrating a clock transmission and reception circuit according to a fifth embodiment.

FIG. 10 is a configuration diagram illustrating a clock transmission and reception circuit according to the fifth embodiment. In FIG. 10, the same reference numerals as those in FIGS. 1, 5, and 8 denote the same or corresponding parts, and thus description thereof is omitted.

The first divide-by-two frequency divider 61 divides the frequency of the phase-shifted reference signal output from the second phase shifter 42 by two, and outputs the reference signal frequency-divided by two to the seventh phase shifter 62.

The seventh phase shifter 62 shifts the phase of the reference signal frequency-divided by two, which is output from the first divide-by-two frequency divider 61, by a seventh phase-shift amount $\theta_{off7}$, and outputs the reference signal phase-shifted by the seventh phase-shift amount $\theta_{off7}$ to the delay-amount control circuit 15. The seventh phase-shift amount $\theta_{off7}$ is a phase shift amount indicated by a phase shift signal $Ps_7$ output from the phase-shift-amount control circuit 65.

The second divide-by-two frequency divider 63 divides the frequency of the phase-shifted second separation signal (2) output from the sixth phase shifter 46 by two, and outputs the second separation signal (2) frequency-divided by two to the eighth phase shifter 64.

The eighth phase shifter 64 shifts the phase of the second separation signal (2) frequency-divided by two, which is output from the second divide-by-two frequency divider 63, by an eighth phase-shift amount $\theta_{off8}$, and outputs the second separation signal (2) phase-shifted by the eighth phase-shift amount $\theta_{off8}$ to the delay-amount control circuit 15. The eighth phase-shift amount $\theta_{off8}$ is a phase shift amount indicated by a phase shift signal $Ps_8$ output from the phase-shift-amount control circuit 65.

The phase-shift-amount control circuit 65 includes the PD 48 and a phase-shift-amount control processing circuit 66.

The phase-shift-amount control circuit 65 detects the phase difference between the reference signal output from the third phase shifter 43 and the feedback signal output from the fifth phase shifter 45.

The phase-shift-amount control circuit 65 compares the detected phase difference with the threshold Th, and controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, the sixth phase-shift amount $\theta_{off6}$, the seventh phase shift amount $\theta_{off7}$, and the eighth phase shift amount $\theta_{off8}$ on the basis of the result of comparison between the phase difference and the threshold Th.

The phase-shift-amount control processing circuit 66 compares the phase difference indicated by the phase difference signal output from the PD 48 with the threshold Th, and controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, the sixth phase-shift amount $\theta_{off6}$, the seventh phase shift amount $\theta_{off7}$, and the eighth phase shift amount $\theta_{off8}$ on the basis of a result of comparison between the phase difference and the threshold Th.

That is, the phase-shift-amount control processing circuit 66 outputs the phase shift signal $Ps_n$ indicating the n-th phase-shift amount $\theta_{offn}$ to the n-th phase shifter on the basis of the result of comparison between the phase difference and the threshold Th. n=1, 2, 3, 4, 5, 6, 7, and 8.

The threshold Th may be stored in an internal memory of the phase-shift-amount control processing circuit 66 or may be provided from the outside of the delay synchronization circuit 3.

Next, an operation of the delay synchronization circuit 3 illustrated in FIG. 10 will be described. The delay synchronization circuit 3 illustrated in FIG. 10 is similar to the delay synchronization circuit 3 illustrated in FIG. 8 except for the first divide-by-two frequency divider 61, the seventh phase shifter 62, the second divide-by-two frequency divider 63, the eighth phase shifter 64, and the phase-shift-amount control circuit 65. Operations of the first divide-by-two frequency divider 61, the seventh phase shifter 62, the second divide-by-two frequency divider 63, the eighth phase shifter 64, and the phase-shift-amount control circuit 65 will be mainly described here.

When receiving the phase-shifted reference signal from the second phase shifter 42, the first divide-by-two frequency divider 61 divides the frequency of the phase-shifted reference signal by two, and outputs the reference signal frequency-divided by two to the seventh phase shifter 62.

When receiving the reference signal frequency-divided by two from the first divide-by-two frequency divider 61, the seventh phase shifter 62 shifts the phase of the reference signal frequency-divided by two by the seventh phase-shift amount $\theta_{off7}$, and outputs the reference signal phase-shifted by the seventh phase-shift amount $\theta_{off7}$ to the PD 16 of the delay-amount control circuit 15.

When receiving the phase-shifted second separation signal (2) from the sixth phase shifter 46, the second divide-by-two frequency divider 63 divides the frequency of the phase-shifted second separation signal (2) by two, and outputs the second separation signal (2) frequency-divided by two to the eighth phase shifter 64.

When receiving the second separation signal (2) frequency-divided by two from the second divide-by-two frequency divider 63, the eighth phase shifter 64 shifts the phase of the second separation signal (2) frequency-divided by two by the eighth phase-shift amount $\theta_{off8}$, and outputs the second separation signal (2) phase-shifted by the eighth phase-shift amount $\theta_{off8}$ to the PD 16 of the delay-amount control circuit 15.

The PD 48 of the phase-shift-amount control circuit 65 acquires the reference signal from the third phase shifter 43 and the feedback signal from the fifth phase shifter 45.

The PD 48 detects the phase difference between the reference signal and the feedback signal, and outputs a phase difference signal indicating the phase difference to the phase-shift-amount control processing circuit 66.

The phase-shift-amount control processing circuit 66 compares the phase difference indicated by the phase difference signal output from the PD 48 with the threshold Th.

The phase-shift-amount control processing circuit 66 controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, the sixth phase-shift amount $\theta_{off6}$, the seventh phase shift amount $\theta_{off7}$, and the eighth phase shift amount $\theta_{off8}$ on the basis of the result of comparison between the phase difference and the threshold Th.

That is, the phase-shift-amount control processing circuit 66 outputs the phase shift signal $Ps_1$ indicating the first phase-shift amount $\theta_{off1}$ to the first phase shifter 41, the phase shift signal $Ps_2$ indicating the second phase-shift amount $\theta_{off2}$ to the second phase shifter 42, and the phase shift signal $Ps_1$ indicating the third phase-shift amount $\theta_{off3}$ to the third phase shifter 43.

In addition, the phase-shift-amount control processing circuit 66 outputs the phase shift signal $Ps_4$ indicating the fourth phase-shift amount $\theta_{off4}$ to the fourth phase shifter 44, the phase shift signal $Ps_5$ indicating the fifth phase-shift amount $\theta_{off5}$ to the fifth phase shifter 45, and the phase shift signal $Ps_6$ indicating the sixth phase-shift amount $\theta_{off6}$ to the sixth phase shifter 46.

Moreover, the phase-shift-amount control processing circuit 66 outputs the phase shift signal $Ps_1$ indicating the seventh phase-shift amount $\theta_{off7}$ to the seventh phase shifter 62 and the phase shift signal $Ps_8$ indicating the eighth phase-shift amount $\theta_{off8}$ to the eighth phase shifter 64.

Since the condition for locking the delay synchronization circuit 3 is that the phase difference between the reference signal and the feedback signal is zero, the phase $\theta_{out}$ of the clock signal output from the output point 24 of the clock reception circuit 21 is represented by the following expression (6) when the delay synchronization circuit 3 is locked.

$$\theta_{out}=2\pi \times k+(\theta_{off2}+\theta_{off3}+\theta_{off4}-\theta_{off5}-\theta_{off6})/2+\theta_{off1}+\theta_{off7}-\theta_{off8} \quad (6)$$

Therefore, when the delay synchronization circuit 3 is locked, the phase difference $\theta_2-\theta_1$ between the phase $\theta_1$ of the reference signal output from the third phase shifter 43 to the pulse synthesizing circuit 11 and the phase $\theta_2$ of the feedback signal output from the fifth phase shifter 45 to the pulse synthesizing circuit 11 is represented by the following expression (7).

$$\theta_2-\theta_1=\pi \times k+\theta_{wire}+(\theta_{off2}+\theta_{off4}+\theta_{off5}-\theta_{off3}-\theta_{off6})/2+\theta_{off8}-\theta_{off7} \quad (7)$$

When no offset is given because the phase difference is larger than the threshold Th, the phase-shift-amount control processing circuit 66 controls each of the first phase shift amount $\theta_{off1}$, the second phase shift amount $\theta_{off2}$, the third phase shift amount $\theta_{off3}$, the fourth phase shift amount $\theta_{off4}$, the fifth phase shift amount $\theta_{off5}$, the sixth phase shift amount $\theta_{off6}$, the seventh phase shift amount $\theta_{off7}$, and the eighth phase shift amount $\theta_{off8}$ as shown by the following expression (8), for example.

$$\theta_{off1}=\theta_{off2}=\theta_{off3}=\theta_{off4}=\theta_{off5}=\theta_{off6}=\theta_{off7}=\theta_{off8}=0 \quad (8)$$

When an offset is given because the phase difference is equal to or less than the threshold Th, the phase-shift-amount control processing circuit 66 controls each of the first phase-shift amount $\theta_{off1}$, the second phase-shift amount $\theta_{off2}$, the third phase-shift amount $\theta_{off3}$, the fourth phase-shift amount $\theta_{off4}$, the fifth phase-shift amount $\theta_{off5}$, the sixth phase-shift amount $\theta_{off6}$, the seventh phase shift amount $\theta_{off7}$, and the eighth phase shift amount $\theta_{off8}$ as shown by the following expression (9), for example.

$$\theta_{off1}=\theta_{off2}=\theta_{off3}=\theta_{off4}=\theta_{off5}=\theta_{off6}=\theta_{off8}=0$$

$$\theta_{off7}=\pi \quad (9)$$

When the phase-shift-amount control processing circuit 66 controls the phase shift amount as shown by the expressions (8) and (9), the phase difference between the reference signal and the feedback signal applied to the pulse synthesizing circuit 11 changes by 180 degrees before and after the offset. Furthermore, the phase $\theta_{out}$ of the clock signal output from the output point 24 of the clock reception circuit 21 changes by 180 degrees before and after the offset.

Since the phase $\theta_{out}$ of the clock signal output from the output point 24 of the clock reception circuit 21 changes by 180 degrees before and after the offset, the external circuit using the clock signal needs to perform compensation to invert the phase of the clock signal after the offset by 180 degrees.

In the delay synchronization circuit 3 illustrated in FIG. 10, each of the first phase shifter 41, the second phase shifter 42, the third phase shifter 43, the fourth phase shifter 44, the fifth phase shifter 45, the sixth phase shifter 46, the seventh phase shifter 62, and the eighth phase shifter 64 may include the first inverter 51 and the first multiplexer 52 as illustrated in FIG. 9.

Sixth Embodiment

In a sixth embodiment, a delay synchronization circuit 3 including a pulse synthesizing circuit 71, a phase difference quantizer 73, and a pulse separation circuit 74 will be described.

Figure 11:
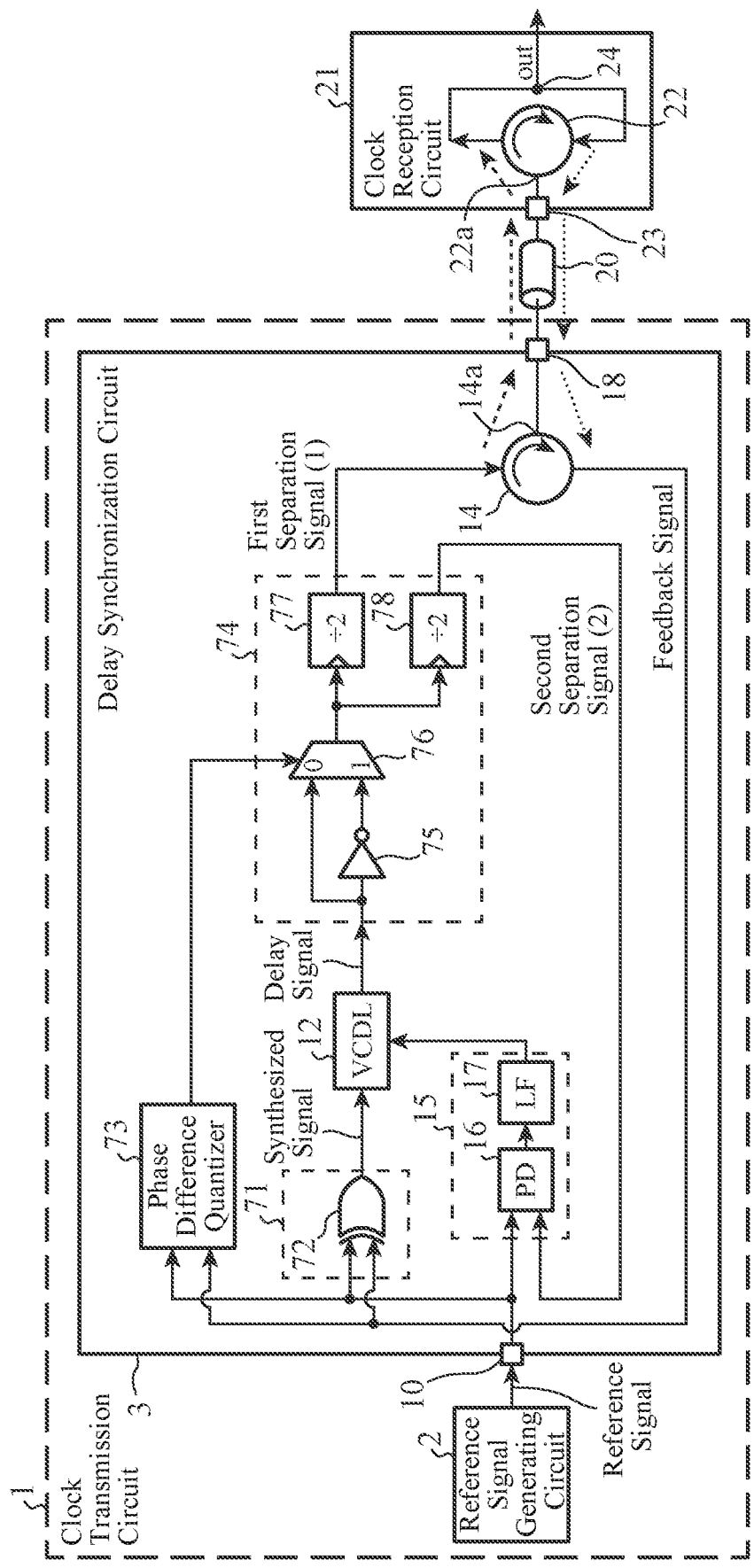
FIG. 11 is a configuration diagram illustrating a clock transmission and reception circuit according to a sixth embodiment.

FIG. 11 is a configuration diagram illustrating a clock transmission and reception circuit according to the sixth embodiment. In FIG. 11, the same reference numerals as those in FIGS. 1, 5, 8, and 10 denote the same or corresponding parts, and thus description thereof is omitted.

The pulse synthesizing circuit 71 includes a first exclusive OR circuit 72.

The pulse synthesizing circuit 71 outputs a synthesized signal indicating the calculation result of exclusive OR by the first exclusive OR circuit 72 to the VCDL 12 instead of generating a synthesized signal including the first pulse signal (1) synchronized with a reference signal and the second pulse signal (1) synchronized with a feedback signal.

The first exclusive OR circuit 72 calculates the exclusive OR of the reference signal output from the reference signal generating circuit 2 and the feedback signal output from the circulator 14.

The first exclusive OR circuit 72 outputs a synthesized signal indicating the calculation result of the exclusive OR to the VCDL 12.

The phase difference quantizer 73 compares the phase of the reference signal output from the reference signal generating circuit 2 with the phase of the feedback signal output from the circulator 14.

The phase difference quantizer 73 outputs a selection signal indicating a signal to be selected to a second multiplexer 76 of the pulse separation circuit 74 on the basis of the phase comparison result.

The pulse separation circuit 74 includes a second inverter 75, the second multiplexer 76, a third divide-by-two frequency divider 77, and a fourth divide-by-two frequency divider 78.

The pulse separation circuit 74 outputs the following first separation signal (1) to the circulator 14 instead of outputting the first separation signal (1) synchronized with a first pulse signal included in a delay signal output from the VCDL 12 to the circulator 14.

In addition, the pulse separation circuit 74 outputs the following second separation signal (2) to the delay-amount control circuit 15 instead of outputting the second separation signal (2) synchronized with a second pulse signal included in a delay signal to the delay-amount control circuit 15.

The second inverter 75 inverts the delay signal output from the VCDL 12 and outputs the inverted delay signal to the second multiplexer 76.

The second multiplexer 76 selects one of the delay signal output from the VCDL 12 and the delay signal output from the second inverter 75 on the basis of the selection signal output from the phase difference quantizer 73.

The second multiplexer 76 outputs the selected delay signal to each of the third divide-by-two frequency divider 77 and the fourth divide-by-two frequency divider 78.

The third divide-by-two frequency divider 77 divides the frequency of the delay signal output from the second multiplexer 76 by two, and outputs the delay signal frequency-divided by two to the circulator 14 as the first separation signal (1).

The fourth divide-by-two frequency divider 78 inverts the delay signal output from the second multiplexer 76, divides the frequency of the inverted delay signal by two, and outputs the delay signal frequency-divided by two to the delay-amount control circuit 15 as the second separation signal (2).

In the delay synchronization circuit 3 illustrated in FIG. 11, the pulse synthesizing circuit 71, the phase difference quantizer 73, and the pulse separation circuit 74 are applied to the delay synchronization circuit 3 illustrated in FIG. 1. However, this is only an example, and the pulse synthesizing circuit 71, the phase difference quantizer 73, and the pulse separation circuit 74 may be applied to the delay synchronization circuit 3 illustrated in FIG. 5, 8, or 10.

Next, an operation of the delay synchronization circuit 3 illustrated in FIG. 11 will be described. Since the delay synchronization circuit 3 illustrated in FIG. 11 is similar to the delay synchronization circuit 3 illustrated in FIG. 1 except for the pulse synthesizing circuit 71, the phase difference quantizer 73, and the pulse separation circuit 74, operations of the pulse synthesizing circuit 71, the phase difference quantizer 73, and the pulse separation circuit 74 will be mainly described here.

Figure 12:
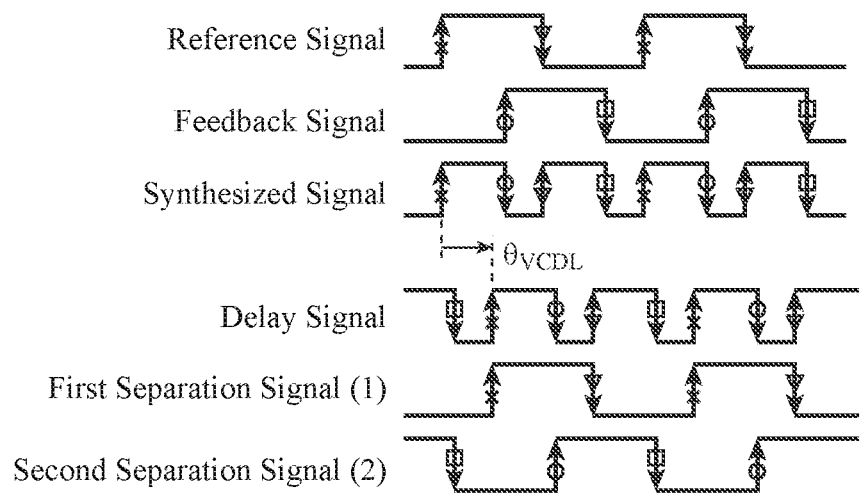
FIG. 12 is an explanatory diagram illustrating waveforms of various signals in a case where the phase of a reference signal advances the phase of a feedback signal.
Figure 13:
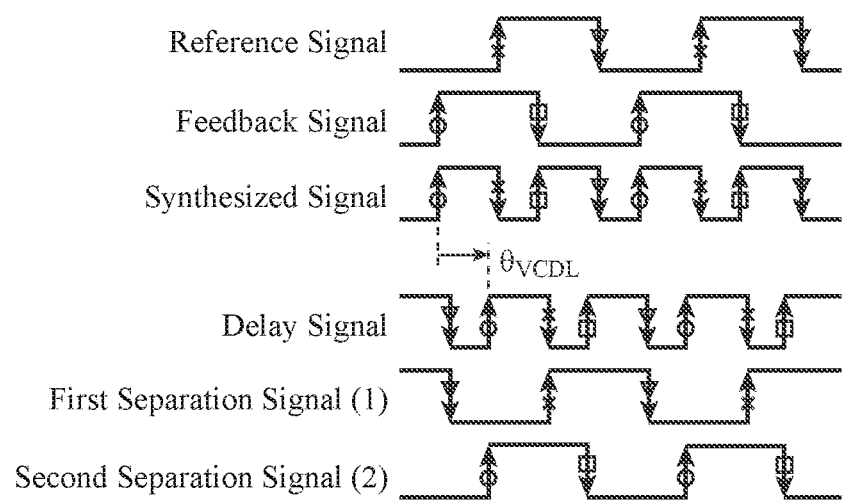
FIG. 13 is an explanatory diagram illustrating waveforms of various signals in a case where the phase of the reference signal is delayed from the phase of the feedback signal.

FIG. 12 is an explanatory diagram illustrating waveforms of various signals in a case where the phase of a reference signal advances over the phase of a feedback signal. FIG. 13 is an explanatory diagram illustrating waveforms of various signals in a case where the phase of the reference signal is delayed from the phase of the feedback signal.

The first exclusive OR circuit 72 of the pulse synthesizing circuit 71 calculates the exclusive OR of the reference signal output from the reference signal generating circuit 2 and the feedback signal output from the circulator 14.

The first exclusive OR circuit 72 outputs a synthesized signal indicating the calculation result of the exclusive OR to the VCDL 12.

The synthesized signal output from the first exclusive OR circuit 72 indicates the calculation result of the exclusive OR of the reference signal and the feedback signal. In a case where the phase of the reference signal advances ahead the phase of the feedback signal, as illustrated in FIG. 12, the rising edge of the synthesized signal may have the same timing as the rising edge of the reference signal, or may have the same timing as the falling edge of the reference signal.

In a case where the phase of the reference signal is delayed from the phase of the feedback signal, as illustrated in FIG. 13, the rising edge of the synthesized signal may have the same timing as the rising edge of the feedback signal, or may have the same timing as the falling edge of the feedback signal.

When receiving the synthesized signal illustrated in FIG. 12 from the first exclusive OR circuit 72 in a case where the phase of the reference signal advances ahead the phase of the feedback signal, the VCDL 12 delays the synthesized signal and outputs a delay signal, which is a delayed synthesized signal, to the pulse separation circuit 74.

When receiving the synthesized signal illustrated in FIG. 13 from the first exclusive OR circuit 72 in a case where the phase of the reference signal is delayed from the phase of the feedback signal, the VCDL 12 delays the synthesized signal and outputs a delay signal, which is a delayed synthesized signal, to the pulse separation circuit 74.

The phase difference quantizer 73 compares the phase of the reference signal output from the reference signal generating circuit 2 with the phase of the feedback signal output from the circulator 14.

The phase difference quantizer 73 outputs a selection signal indicating a signal to be selected to the second multiplexer 76 of the pulse separation circuit 74 on the basis of the phase comparison result.

When the phase of the reference signal advances ahead the phase of the feedback signal, the selection signal output from the phase difference quantizer 73 indicates that the delay signal output from the VCDL 12 is a signal to be selected.

When the phase of the reference signal is delayed from the phase of the feedback signal, the selection signal output from the phase difference quantizer 73 indicates that the delay signal output from the second inverter 75 is a signal to be selected.

When receiving the delay signal from the VCDL 12, the second inverter 75 inverts the delay signal and outputs the inverted delay signal to the second multiplexer 76.

When the selection signal output from the phase difference quantizer 73 indicates that the delay signal output from the VCDL 12 is a signal to be selected, the second multiplexer 76 selects the delay signal output from the VCDL 12 out of the delay signal output from the VCDL 12 and the delay signal output from the second inverter 75.

That is, when the phase of the reference signal advances ahead the phase of the feedback signal, the second multiplexer 76 selects the delay signal illustrated in FIG. 12.

When the selection signal output from the phase difference quantizer 73 indicates that the delay signal output from the second inverter 75 is a signal to be selected, the second multiplexer 76 selects the delay signal output from the second inverter 75.

That is, when the phase of the reference signal is delayed from the phase of the feedback signal, the second multiplexer 76 selects the delay signal illustrated in FIG. 13.

The second multiplexer 76 outputs the selected delay signal to each of the third divide-by-two frequency divider 77 and the fourth divide-by-two frequency divider 78.

When the phase of the reference signal advances ahead the phase of the feedback signal, the third divide-by-two frequency divider 77 receives the delay signal illustrated in FIG. 12 from the second multiplexer 76, divides the frequency of the delay signal by two, and outputs the delay signal frequency-divided by two, which is illustrated in FIG. 12, to the circulator 14 as the first separation signal (1).

When the phase of the reference signal is delayed from the phase of the feedback signal, the third divide-by-two frequency divider 77 receives the delay signal illustrated in FIG. 13 from the second multiplexer 76, divides the frequency of the delay signal by two, and outputs the delay signal frequency-divided by two, which is illustrated in FIG. 13, to the circulator 14 as the first separation signal (1).

When the phase of the reference signal advances ahead the phase of the feedback signal, the fourth divide-by-two frequency divider 78 receives the delay signal illustrated in FIG. 12 from the second multiplexer 76, inverts the delay signal, and divides the frequency of the inverted delay signal by two. The delay signal obtained by frequency-dividing the inverted delay signal by two is the second separation signal (2) illustrated in FIG. 12.

The fourth divide-by-two frequency divider 78 outputs the second separation signal (2) illustrated in FIG. 12 to the PD 16 of the delay-amount control circuit 15.

When the phase of the reference signal is delayed from the phase of the feedback signal, the fourth divide-by-two frequency divider 78 receives the delay signal illustrated in FIG. 13 from the second multiplexer 76, inverts the delay signal, and divides the frequency of the inverted delay signal by two. The delay signal obtained by frequency-dividing the inverted delay signal by two is the second separation signal (2) illustrated in FIG. 13.

The fourth divide-by-two frequency divider 78 outputs the second separation signal (2) illustrated in FIG. 13 to the PD 16 of the delay-amount control circuit 15.

In the sixth embodiment above, the delay synchronization circuit 3 illustrated in FIG. 11 is configured to include the pulse synthesizing circuit 71, the phase difference quantizer 73, and the pulse separation circuit 74. As a result, similarly to the delay synchronization circuit 3 illustrated in FIG. 1, the delay synchronization circuit 3 illustrated in FIG. 11 can prevent a reduction in the amount of suppression of disturbance due to the difference in delay variable characteristics between two VCDLs. In addition, regardless of the magnitude of the delay amount of the first separation signal (1) through the cable 20, the delay synchronization circuit 3 illustrated in FIG. 11 can generate a synthesized signal including both the first pulse signal (1) and the second pulse signal (2).

Seventh Embodiment

In a seventh embodiment, a delay synchronization circuit 3 in which the pulse synthesizing circuit 11 includes a first ratio control circuit 81, a second ratio control circuit 82, and an OR circuit 83 will be described.

Figure 14:
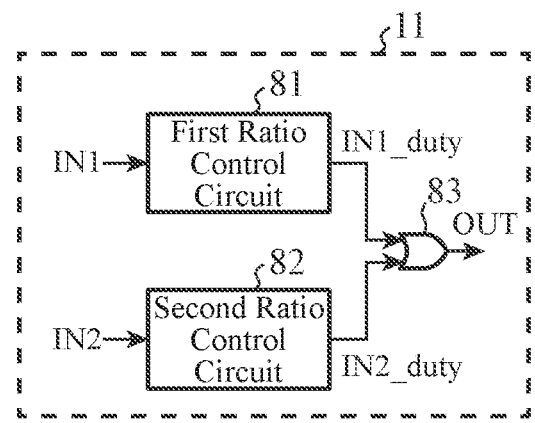
FIG. 14 is a configuration diagram illustrating a pulse synthesizing circuit 11 of a delay synchronization circuit 3 according to a seventh embodiment.

FIG. 14 is a configuration diagram illustrating the pulse synthesizing circuit 11 of the delay synchronization circuit 3 according to the seventh embodiment.

The pulse synthesizing circuit 11 includes the first ratio control circuit 81, the second ratio control circuit 82, and the OR circuit 83.

The first ratio control circuit 81 reduces the duty ratio of a reference signal output from the reference signal generating circuit 2, and outputs the reference signal with a reduced duty ratio to the OR circuit 83.

The second ratio control circuit 82 reduces the duty ratio of a feedback signal output from the circulator 14, and outputs the feedback signal with a reduced duty ratio to the OR circuit 83.

The OR circuit 83 calculates OR of the reference signal having the duty ratio reduced by the first ratio control circuit 81 and the feedback signal having the duty ratio reduced by the second ratio control circuit 82, and outputs a synthesized signal indicating the calculation result of the OR to the VCDL 12.

The configuration of the delay synchronization circuit 3 according to the seventh embodiment is similar to the configuration of the delay synchronization circuit 3 according to the first to fifth embodiments, and FIG. 1, 5, 8, or 10 is a configuration diagram illustrating the delay synchronization circuit 3 according to the seventh embodiment.

Figure 15:
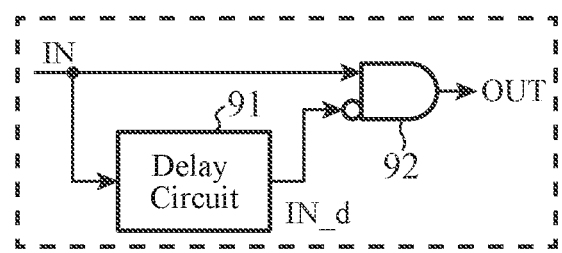
FIG. 15 is a configuration diagram illustrating the inside of each of a first ratio control circuit 81 and a second ratio control circuit 82 illustrated in FIG. 14.

FIG. 15 is a configuration diagram illustrating the inside of each of the first ratio control circuit 81 and the second ratio control circuit 82 illustrated in FIG. 14.

Each of the first ratio control circuit 81 and the second ratio control circuit 82 includes a delay circuit 91 and a logic circuit 92.

The delay circuit 91 delays an input signal and outputs a delay signal, which is a delayed input signal, to the logic circuit 92. The input signal is a reference signal or a feedback signal.

The logic circuit 92 inverts the delay signal output from the delay circuit 91. The logic circuit 92 calculates AND of the input signal and the inverted delay signal, thereby generating a signal that rises at the same timing as the input signal and has a duty ratio smaller than that of the input signal. The signal generated by the logic circuit 92 is a reference signal with a reduced duty ratio or a feedback signal with a reduced duty ratio.

Next, an operation of the pulse synthesizing circuit 11 illustrated in FIG. 14 will be described.

Figure 16:
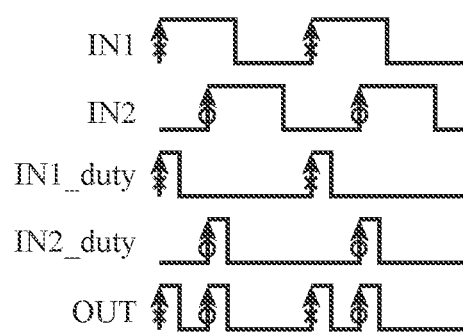
FIG. 16 is an explanatory diagram illustrating waveforms of various signals related to the pulse synthesizing circuit 11.

FIG. 16 is an explanatory diagram illustrating waveforms of various signals related to the pulse synthesizing circuit 11.

Figure 17:
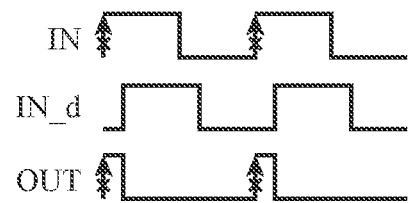
FIG. 17 is an explanatory diagram illustrating waveforms of various signals in the first ratio control circuit 81 and the second ratio control circuit 82.

FIG. 17 is an explanatory diagram illustrating waveforms of various signals in the first ratio control circuit 81 and the second ratio control circuit 82.

In FIG. 16, IN1 indicates a reference signal output from the reference signal generating circuit 2 and IN2 indicates a feedback signal output from the circulator 14.

When receiving the reference signal IN1 from the reference signal generating circuit 2, as illustrated in FIG. 16, the first ratio control circuit 81 reduces the duty ratio of the reference signal IN1 and outputs a reference signal IN1_duty with a reduced duty ratio to the OR circuit 83.

That is, when receiving the reference signal IN1, the delay circuit 91 of the first ratio control circuit 81 delays the reference signal IN1 (in FIG. 17, an input signal IN) as illustrated in FIG. 17, and outputs a delay signal (in FIG. 17, an input signal IN_d), which is a delayed reference signal IN1, to the logic circuit 92.

The logic circuit 92 inverts the delay signal (in FIG. 17, the input signal IN_d) that is the delayed reference signal IN1 output from the delay circuit 91.

The logic circuit 92 calculates AND of the reference signal IN1 (in FIG. 17, the input signal IN) and the inverted delay signal, thereby generating a signal (in FIG. 17, OUT) that rises at the same timing as the reference signal IN1 and has a duty ratio smaller than that of the reference signal IN1.

When receiving the feedback signal IN2 from the circulator 14, the second ratio control circuit 82 reduces the duty ratio of the feedback signal IN2 as illustrated in FIG. 16, and outputs a feedback signal IN2_duty with a reduced duty ratio to the OR circuit 83.

That is, when receiving the feedback signal IN2, the delay circuit 91 of the second ratio control circuit 82 delays the feedback signal IN2 (in FIG. 17, the input signal IN) as illustrated in FIG. 17, and outputs a delay signal (in FIG. 17, the input signal IN_d), which is a delayed feedback signal IN2, to the logic circuit 92.

The logic circuit 92 inverts the delay signal (in FIG. 17, the input signal IN_d) that is the delayed feedback signal IN2 output from the delay circuit 91.

The logic circuit 92 calculates AND of the feedback signal IN2 (in FIG. 17, the input signal IN) and the inverted delay signal, thereby generating a signal (in FIG. 17, OUT) that rises at the same timing as the feedback signal IN2 and has a duty ratio smaller than that of the feedback signal IN2.

The OR circuit 83 calculates OR of the reference signal having the duty ratio reduced by the first ratio control circuit 81 and the feedback signal having the duty ratio reduced by the second ratio control circuit 82.

As illustrated in FIG. 16, the OR circuit 83 outputs a synthesized signal OUT indicating the calculation result of the OR to the VCDL 12.

Eighth Embodiment

In an eighth embodiment, a delay synchronization circuit 3 in which the pulse separation circuit 13 includes a fifth divide-by-two frequency divider 93 will be described.

Figure 18:
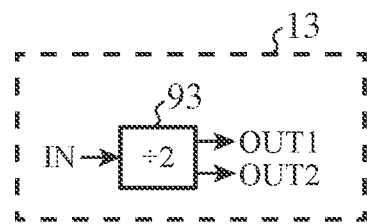
FIG. 18 is a configuration diagram illustrating a pulse separation circuit 13 of a delay synchronization circuit 3 according to an eighth embodiment.

FIG. 18 is a configuration diagram illustrating the pulse separation circuit 13 of the delay synchronization circuit 3 according to the eighth embodiment.

The pulse separation circuit 13 includes the fifth divide-by-two frequency divider 93.

The fifth divide-by-two frequency divider 93 divides the frequency of the delay signal output from the VCDL 12 by two.

The fifth divide-by-two frequency divider 93 outputs the delay signal frequency-divided by two to the circulator 14 as the first separation signal (1), and also outputs an inverted signal of the delay signal frequency-divided by two to the delay-amount control circuit 15 as the second separation signal (2).

The configuration of the delay synchronization circuit 3 according to the eighth embodiment is similar to the configuration of the delay synchronization circuit 3 according to the first to fifth and seventh embodiments, and FIG. 1, 5, 8, or 10 is a configuration diagram illustrating the delay synchronization circuit 3 according to the eighth embodiment.

Figure 19:
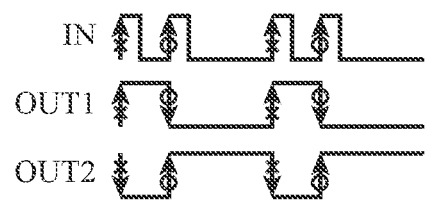
FIG. 19 is an explanatory diagram illustrating waveforms of various signals related to the pulse separation circuit 13.

FIG. 19 is an explanatory diagram illustrating waveforms of various signals related to the pulse separation circuit 13.

When receiving a delay signal (in FIG. 19, IN) from the VCDL 12, the fifth divide-by-two frequency divider 93 of the pulse separation circuit 13 divides the frequency of the delay signal by two.

The fifth divide-by-two frequency divider 93 outputs, as the first separation signal (1), a delay signal (in FIG. 19, OUT1) frequency-divided by two that rises at the same timing as the delay signal output from the VCDL 12 to the circulator 14.

In addition, the fifth divide-by-two frequency divider 93 outputs an inverted signal (in FIG. 19, OUT2) of the delay signal frequency-divided by two to the delay-amount control circuit 15 as the second separation signal (2).

Ninth Embodiment

In a ninth embodiment, a delay synchronization circuit 3 will be described in which the pulse synthesizing circuit 11 includes a first pulse synthesizer 11a, a first inverter 11b, a second inverter 11c, and a second pulse synthesizer 11d, the VCDL 12 includes a first signal delay unit 12a and a second signal delay unit 12b, and the pulse separation circuit 13 includes a first pulse separator 13a, a second pulse separator 13b, a first edge synthesizer 13c, and a second edge synthesizer 13d.

Figure 20:
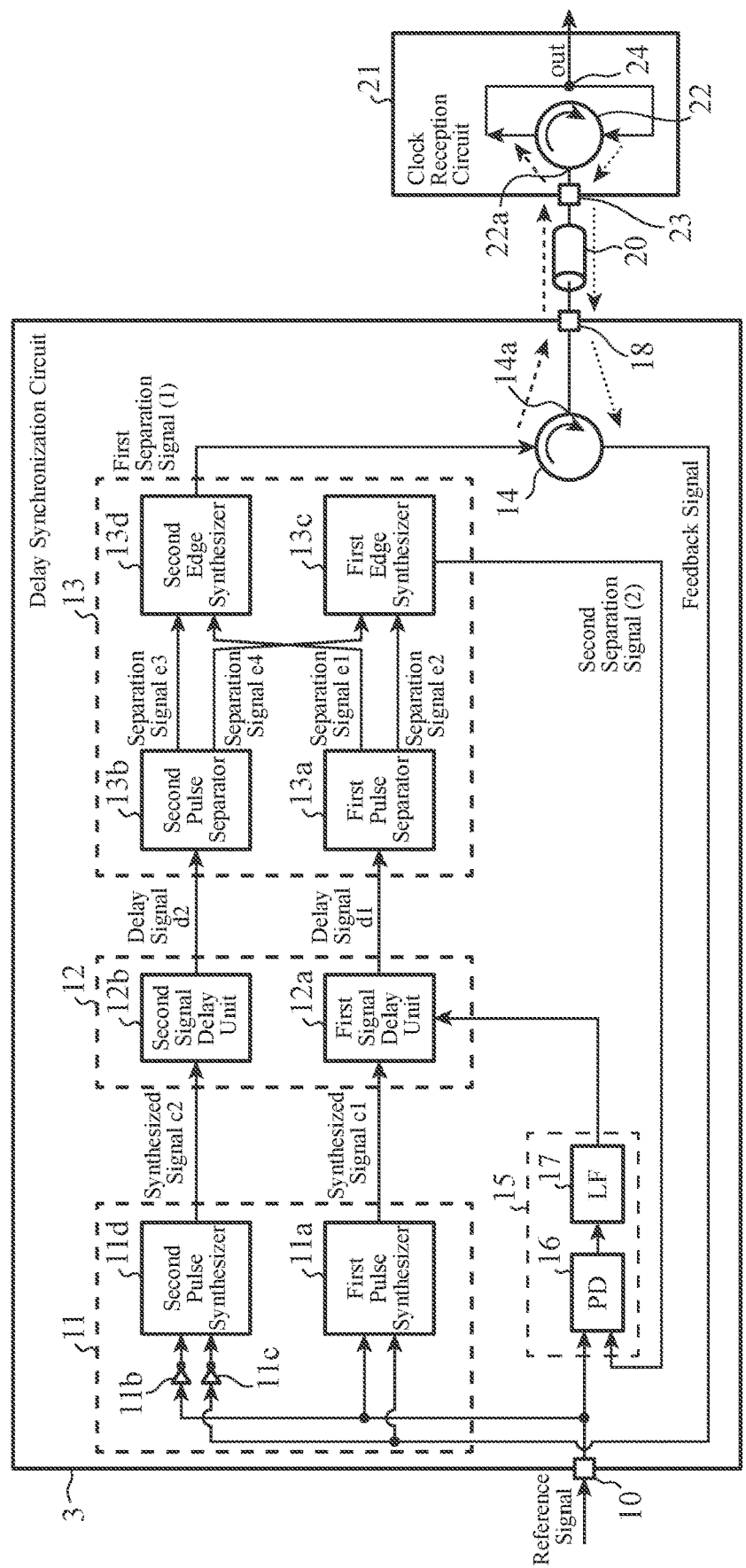
FIG. 20 is a configuration diagram illustrating a delay synchronization circuit 3 and a clock reception circuit 21 according to a ninth embodiment.

FIG. 20 is a configuration diagram illustrating each of the delay synchronization circuit 3 and the clock reception circuit 21 according to the ninth embodiment. In FIG. 20, the same reference numerals as those in FIG. 1 denote the same or corresponding parts, and thus description thereof is omitted.

The pulse synthesizing circuit 11 includes the first pulse synthesizer 11a, the first inverter 11b, the second inverter 11c, and the second pulse synthesizer 11d.

The first pulse synthesizer 11a generates, as a first pulse signal synchronized with a reference signal generated by the reference signal generating circuit 2, a third pulse signal that rises at the same timing as the reference signal.

The first pulse synthesizer 11a generates a fourth pulse signal that rises at the same timing as a feedback signal as a second pulse signal synchronized with the feedback signal output from the circulator 14.

The pulse synthesizing circuit 11 generates a first synthesized signal c1 including the third pulse signal and the fourth pulse signal, and outputs the first synthesized signal c1 to the first signal delay unit 12a.

The first inverter 11b inverts the reference signal generated by the reference signal generating circuit 2 and outputs the inverted reference signal to the second pulse synthesizer 11d.

The second inverter 11c inverts the feedback signal output from the circulator 14 and outputs the inverted feedback signal to the second pulse synthesizer 11d.

The second pulse synthesizer 11d generates, as a first pulse signal, a fifth pulse signal that rises at the same timing as the inverted reference signal output from the first inverter 11b. The timing at which the fifth pulse signal rises is the same as the timing at which the reference signal generated by the reference signal generating circuit 2 falls.

In addition, the second pulse synthesizer 11d generates, as a second pulse signal, a sixth pulse signal that rises at the same timing as the inverted feedback signal output from the second inverter 11c. The timing at which the sixth pulse signal rises is the same as the timing at which the feedback signal output from the circulator 14 falls.

The second pulse synthesizer 11d generates a second synthesized signal c2 including the fifth pulse signal and the sixth pulse signal, and outputs the second synthesized signal c2 to the second signal delay unit 12b.

The VCDL 12 includes the first signal delay unit 12a and the second signal delay unit 12b.

The first signal delay unit 12a is a VCDL, delays the first synthesized signal c1 generated by the first pulse synthesizer 11a, and outputs the delayed first synthesized signal to the first pulse separator 13a as a first delay signal d1.

The second signal delay unit 12b is a VCDL, delays the second synthesized signal c2 generated by the second pulse synthesizer 11d, and outputs the delayed second synthesized signal to the second pulse separator 13b as a second delay signal d2.

The pulse separation circuit 13 includes the first pulse separator 13a, the second pulse separator 13b, the first edge synthesizer 13c, and the second edge synthesizer 13d.

The first pulse separator 13a generates a third separation signal e1 that rises at the same timing as the third pulse signal included in the first delay signal d1 output from the first signal delay unit 12a.

The first pulse separator 13a generates a fourth separation signal e2 that rises at the same timing as the fourth pulse signal included in the first delay signal d1.

The first pulse separator 13a outputs the third separation signal e1 to the second edge synthesizer 13d, and the fourth separation signal e2 to the first edge synthesizer 13c.

The second pulse separator 13b generates a fifth separation signal e3 that rises at the same timing as the fifth pulse signal included in the second delay signal d2 output from the second signal delay unit 12b.

The second pulse separator 13b generates a sixth separation signal e4 that rises at the same timing as the sixth pulse signal included in the second delay signal d2.

The second pulse separator 13b outputs the fifth separation signal e3 to the second edge synthesizer 13d, and the sixth separation signal e4 to the first edge synthesizer 13c.

The first edge synthesizer 13c generates the second separation signal (2) from the fourth separation signal e2 output from the first pulse separator 13a and the sixth separation signal e4 output from the second pulse separator 13b, and outputs the second separation signal (2) to the delay-amount control circuit 15.

The second edge synthesizer 13d generates the first separation signal (1) from the third separation signal e1 output from the first pulse separator 13a and the fifth separation signal e3 output from the second pulse separator 13b, and outputs the first separation signal (1) to the circulator 14.

In the delay synchronization circuit 3 illustrated in FIG. 20, the first pulse synthesizer 11a, the first inverter 11b, the second inverter 11c, the second pulse synthesizer 11d, the first signal delay unit 12a, the second signal delay unit 12b, the first pulse separator 13a, the second pulse separator 13b, the first edge synthesizer 13c, and the second edge synthesizer 13d are applied to the delay synchronization circuit 3 illustrated in FIG. 1. However, this is only an example, and the first pulse synthesizer 11a, the first inverter 11b, the second inverter 11c, the second pulse synthesizer 11d, the first signal delay unit 12a, the second signal delay unit 12b, the first pulse separator 13a, the second pulse separator 13b, the first edge synthesizer 13c, and the second edge synthesizer 13d may be applied to the delay synchronization circuit 3 illustrated in FIG. 5, 8, or 10.

Next, an operation of the delay synchronization circuit 3 illustrated in FIG. 20 will be described. Since the delay synchronization circuit 3 illustrated in FIG. 20 is similar to the delay synchronization circuit 3 illustrated in FIG. 1 except for the pulse synthesizing circuit 11, the VCDL 12, and the pulse separation circuit 13, only the operations of the pulse synthesizing circuit 11, the VCDL 12, and the pulse separation circuit 13 will be described here.

Figure 21:
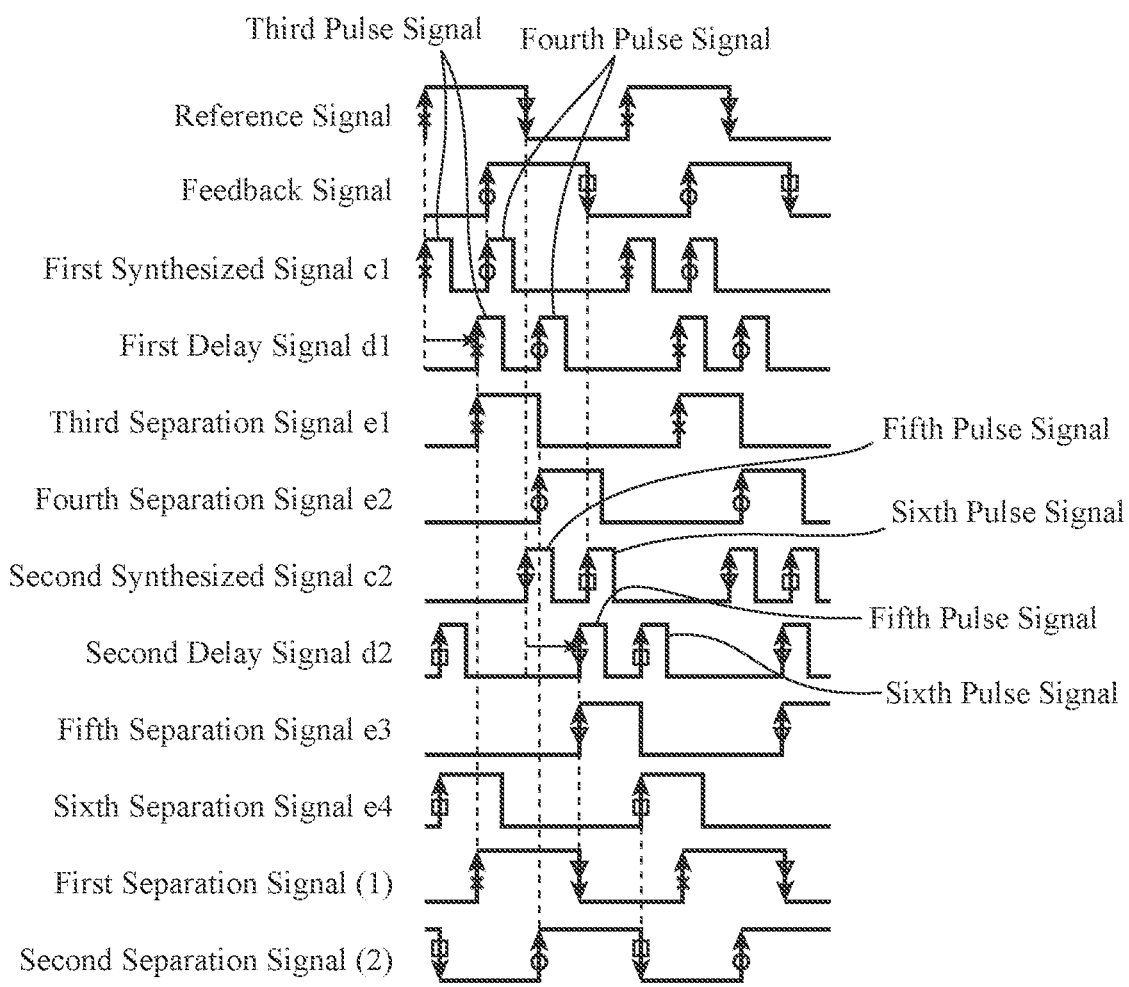
FIG. 21 is an explanatory diagram illustrating waveforms of various signals in the delay synchronization circuit 3 illustrated in FIG. 20.

FIG. 21 is an explanatory diagram illustrating waveforms of various signals in the delay synchronization circuit 3 illustrated in FIG. 20.

First, the first pulse synthesizer 11a acquires a reference signal from the reference signal generating circuit 2 and a feedback signal from the circulator 14.

As illustrated in FIG. 21, the first pulse synthesizer 11a generates a third pulse signal rising at the same timing as the reference signal and a fourth pulse signal rising at the same timing as the feedback signal.

As illustrated in FIG. 21, the pulse synthesizing circuit 11 generates the first synthesized signal c1 including the third pulse signal and the fourth pulse signal, and outputs the first synthesized signal c1 to the first signal delay unit 12a.

The first inverter 11b inverts the reference signal generated by the reference signal generating circuit 2 and outputs the inverted reference signal to the second pulse synthesizer 11d.

The second inverter 11c inverts the feedback signal output from the circulator 14 and outputs the inverted feedback signal to the second pulse synthesizer 11d.

The second pulse synthesizer 11d acquires the inverted reference signal from the first inverter 11b and the inverted feedback signal from the second inverter 11c.

As illustrated in FIG. 21, the second pulse synthesizer 11d generates a fifth pulse signal rising at the same timing as the inverted reference signal.

As illustrated in FIG. 21, the second pulse synthesizer 11d generates a sixth pulse signal rising at the same timing as the inverted feedback signal.

As illustrated in FIG. 21, the second pulse synthesizer 11d generates the second synthesized signal c2 including the fifth pulse signal and the sixth pulse signal, and outputs the second synthesized signal c2 to the second signal delay unit 12b.

When receiving the first synthesized signal c1 from the first pulse synthesizer 11a, the first signal delay unit 12a delays the first synthesized signal c1 and outputs the delayed first synthesized signal to the first pulse separator 13a as the first delay signal d1, as illustrated in FIG. 21.

When receiving the second synthesized signal c2 from the second pulse synthesizer 11d, the second signal delay unit 12b delays the second synthesized signal c2 and outputs the delayed second synthesized signal to the second pulse separator 13b as the second delay signal d2, as illustrated in FIG. 21.

When receiving the first delay signal d1 from the first signal delay unit 12a, the first pulse separator 13a generates the third separation signal e1 that rises at the same timing as the third pulse signal included in the first delay signal d1, as illustrated in FIG. 21.

The first pulse separator 13a generates the fourth separation signal e2 that rises at the same timing as the fourth pulse signal included in the first delay signal d1, as illustrated in FIG. 21.

The first pulse separator 13a outputs the third separation signal e1 to the second edge synthesizer 13d, and the fourth separation signal e2 to the first edge synthesizer 13c.

When receiving the second delay signal d2 from the second signal delay unit 12b, the second pulse separator 13b generates the fifth separation signal e3 that rises at the same timing as the fifth pulse signal included in the second delay signal d2, as illustrated in FIG. 21.

The second pulse separator 13b generates the sixth separation signal e4 that rises at the same timing as the sixth pulse signal included in the second delay signal d2, as illustrated in FIG. 21.

The second pulse separator 13b outputs the fifth separation signal e3 to the second edge synthesizer 13d, and the sixth separation signal e4 to the first edge synthesizer 13c.

The first edge synthesizer 13c generates the second separation signal (2) from the fourth separation signal e2 output from the first pulse separator 13a and the sixth separation signal e4 output from the second pulse separator 13b.

That is, as illustrated in FIG. 21, the first edge synthesizer 13c generates the second separation signal (2) that rises at the same timing as the fourth separation signal e2 and falls at the timing when the sixth separation signal e4 rises.

The first edge synthesizer 13c outputs the second separation signal (2) to the delay-amount control circuit 15.

The second edge synthesizer 13d generates the first separation signal (1) from the third separation signal e1 output from the first pulse separator 13a and the fifth separation signal e3 output from the second pulse separator 13b.

That is, as illustrated in FIG. 21, the second edge synthesizer 13d generates the first separation signal (1) that rises at the same timing as the third separation signal e1 and falls at the timing when the fifth separation signal e3 rises.

The second edge synthesizer 13d outputs the first separation signal (1) to the circulator 14.

The first separation signal (1) output from the circulator 14 to the clock reception circuit 21 is a clock signal including rising edge information and falling edge information as phase information.

Tenth Embodiment

In a tenth embodiment, a delay synchronization circuit 3 will be described in which the first edge synthesizer 13c includes a sixth divide-by-two frequency divider 101, a seventh divide-by-two frequency divider 102, and a second exclusive OR circuit 103, and the second edge synthesizer 13d includes an eighth divide-by-two frequency divider 104, a ninth divide-by-two frequency divider 105, and a third exclusive OR circuit 106.

Figure 22:
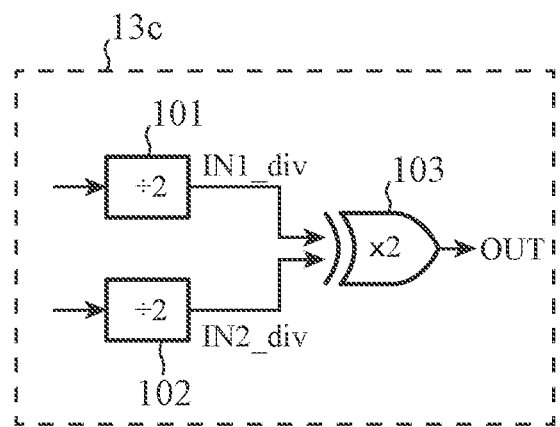
FIG. 22 is a configuration diagram illustrating a first edge synthesizer 13c of a delay synchronization circuit 3 according to a tenth embodiment.

FIG. 22 is a configuration diagram illustrating the first edge synthesizer 13c of the delay synchronization circuit 3 according to the tenth embodiment.

Figure 23:
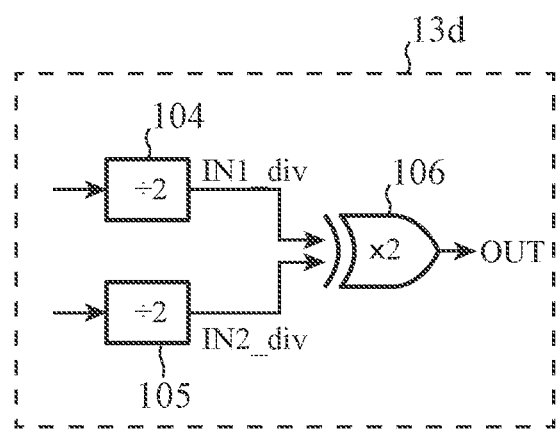
FIG. 23 is a configuration diagram illustrating a second edge synthesizer 13d of the delay synchronization circuit 3 according to the tenth embodiment.

FIG. 23 is a configuration diagram illustrating the second edge synthesizer 13d of the delay synchronization circuit 3 according to the tenth embodiment.

The configuration of the delay synchronization circuit 3 according to the tenth embodiment is similar to the configuration of the delay synchronization circuit 3 according to the ninth embodiment, and FIG. 20 is a configuration diagram illustrating the delay synchronization circuit 3 according to the tenth embodiment.

The first edge synthesizer 13c includes the sixth divide-by-two frequency divider 101, the seventh divide-by-two frequency divider 102, and the second exclusive OR circuit 103.

The sixth divide-by-two frequency divider 101 divides the frequency of the fourth separation signal e2 output from the first pulse separator 13a by two, and outputs the fourth separation signal frequency-divided by two to the exclusive OR circuit 103.

The seventh divide-by-two frequency divider 102 divides the frequency of the sixth separation signal e4 output from the second pulse separator 13b by two, and outputs the sixth separation signal frequency-divided by two to the exclusive OR circuit 103.

The exclusive OR circuit 103 calculates exclusive OR of the fourth separation signal frequency-divided by two, which is output from the sixth divide-by-two frequency divider 101, and the sixth separation signal frequency-divided by two, which is output from the seventh divide-by-two frequency divider 102, and generates a signal indicating the calculation result of the exclusive OR as the second separation signal (2).

The exclusive OR circuit 103 outputs the second separation signal (2) to the delay-amount control circuit 15.

The second edge synthesizer 13d includes the eighth divide-by-two frequency divider 104, the ninth divide-by-two frequency divider 105, and the third exclusive OR circuit 106.

The eighth divide-by-two frequency divider 104 divides the frequency of the third separation signal e1 output from the first pulse separator 13a by two, and outputs the third separation signal frequency-divided by two to the exclusive OR circuit 106.

The ninth divide-by-two frequency divider 105 divides the frequency of the fifth separation signal e3 output from the second pulse separator 13b by two, and outputs the fifth separation signal frequency-divided by two to the exclusive OR circuit 106.

The exclusive OR circuit 106 calculates exclusive OR of the third separation signal frequency-divided by two, which is output from the eighth divide-by-two frequency divider 104, and the fifth separation signal frequency-divided by two, which is output from the ninth divide-by-two frequency divider 105, and generates a signal indicating the calculation result of the exclusive OR as the first separation signal (1).

The exclusive OR circuit 106 outputs the first separation signal (1) to the circulator 14.

Next, operations of the first edge synthesizer 13c and the second edge synthesizer 13d will be described.

Figure 24:
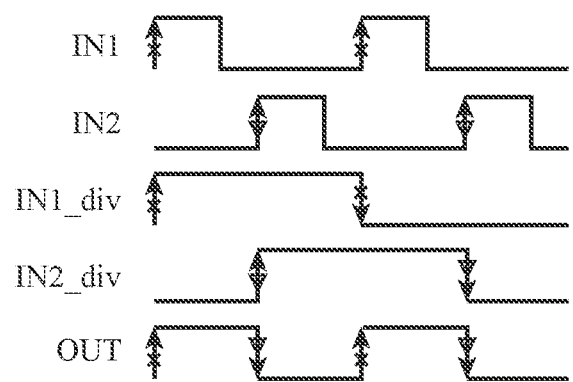
FIG. 24 is an explanatory diagram illustrating waveforms of various signals in the first edge synthesizer 13c.

FIG. 24 is an explanatory diagram illustrating waveforms of various signals in the first edge synthesizer 13c.

Figure 25:
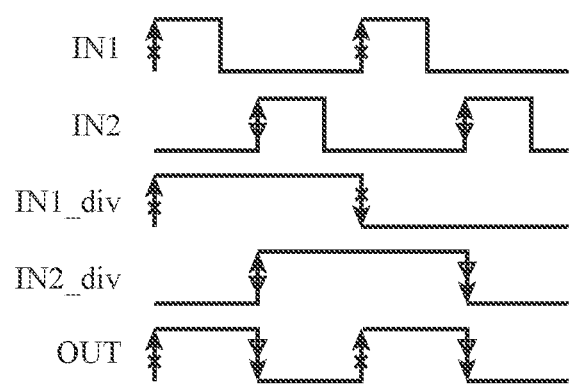
FIG. 25 is an explanatory diagram illustrating waveforms of various signals in the second edge synthesizer 13d.

FIG. 25 is an explanatory diagram illustrating waveforms of various signals in the second edge synthesizer 13d.

First, the operation of the first edge synthesizer 13c will be described.

When receiving the fourth separation signal e2 (in FIG. 24, denoted as "IN1") from the first pulse separator 13a, the sixth divide-by-two frequency divider 101 divides the frequency of the fourth separation signal e2 by two.

The sixth divide-by-two frequency divider 101 outputs the fourth separation signal (in FIG. 24, denoted as "IN1_div") frequency-divided by two to the exclusive OR circuit 103.

When receiving the sixth separation signal e4 (in FIG. 24, denoted as "IN2") from the second pulse separator 13b, the seventh divide-by-two frequency divider 102 divides the frequency of the sixth separation signal e4 by two.

The seventh divide-by-two frequency divider 102 outputs the sixth separation signal (in FIG. 24, denoted as "IN2_div") frequency-divided by two to the exclusive OR circuit 103.

The exclusive OR circuit 103 calculates exclusive OR of the fourth separation signal frequency-divided by two, which is output from the sixth divide-by-two frequency divider 101, and the sixth separation signal frequency-divided by two, which is output from the seventh divide-by-two frequency divider 102.

The exclusive OR circuit 103 outputs a signal (in FIG. 24, denoted as "OUT") indicating the calculation result of the exclusive OR to the delay-amount control circuit 15 as the second separation signal (2).

Next, the operation of the second edge synthesizer 13d will be described.

When receiving the third separation signal e1 (in FIG. 25, denoted as "IN1") from the first pulse separator 13a, the eighth divide-by-two frequency divider 104 divides the frequency of the third separation signal e1 by two.

The eighth divide-by-two frequency divider 104 outputs the third separation signal (in FIG. 25, denoted as "IN1_div") frequency-divided by two to the exclusive OR circuit 106.

When receiving the fifth separation signal e3 (in FIG. 25, denoted as "IN2") from the second pulse separator 13b, the ninth divide-by-two frequency divider 105 divides the frequency of the fifth separation signal e3 by two.

The ninth divide-by-two frequency divider 105 outputs the fifth separation signal (in FIG. 25, denoted as "IN2_div") frequency-divided by two to the exclusive OR circuit 106.

The exclusive OR circuit 106 calculates exclusive OR of the third separation signal frequency-divided by two, which is output from the eighth divide-by-two frequency divider 104, and the fifth separation signal frequency-divided by two, which is output from the ninth divide-by-two frequency divider 105.

The exclusive OR circuit 106 outputs a signal (in FIG. 25, denoted as "OUT") indicating the calculation result of the exclusive OR to the circulator 14 as the first separation signal (1).

Eleventh Embodiment

In an eleventh embodiment, a clock transmission and reception circuit in which the delay synchronization circuit 3 includes a delay-amount control circuit 111 and the clock reception circuit 21 includes the duty ratio adjusting circuit 25 will be described.

Figure 26:
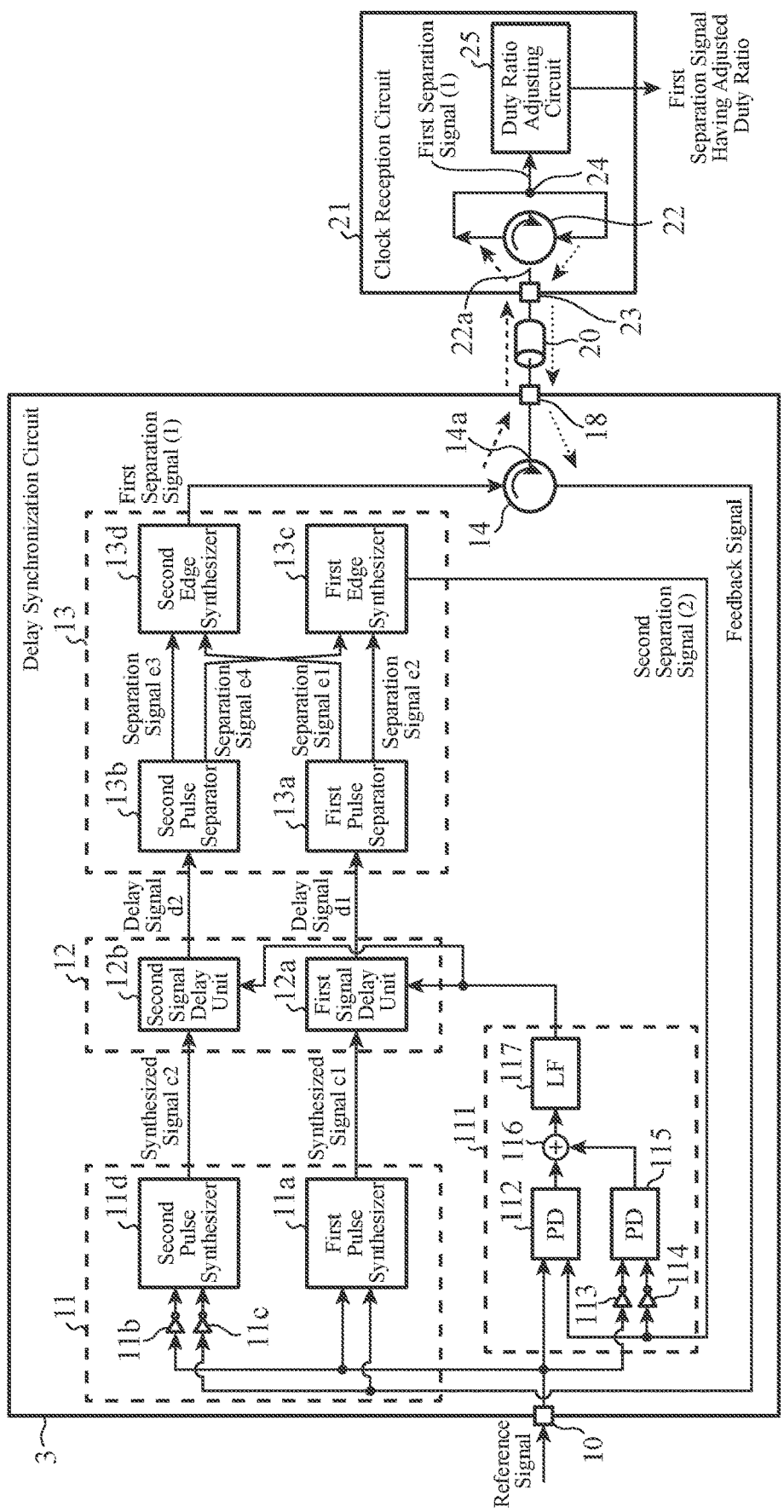
FIG. 26 is a configuration diagram illustrating a delay synchronization circuit 3 and a clock reception circuit 21 according to an eleventh embodiment.

FIG. 26 is a configuration diagram illustrating each of the delay synchronization circuit 3 and the clock reception circuit 21 according to the eleventh embodiment. In FIG. 26, the same reference numerals as those in FIGS. 1 and 20 denote the same or corresponding parts, and thus description thereof is omitted.

The delay synchronization circuit 3 illustrated in FIG. 26 includes the delay-amount control circuit 111.

The delay-amount control circuit 111 includes a first phase detector (hereinafter, referred to as "first PD") 112, a third inverter 113, a fourth inverter 114, a second phase detector (hereinafter, referred to as "second PD") 115, an adder 116, and an LF 117.

The first PD 112 detects the phase difference between a reference signal output from the reference signal generating circuit 2 and the second separation signal (2) output from the first edge synthesizer 13c, and outputs a phase difference signal indicating the phase difference to the adder 116.

The third inverter 113 inverts the reference signal output from the reference signal generating circuit 2 and outputs the inverted reference signal to the second PD 115.

The fourth inverter 114 inverts the second separation signal (2) output from the first edge synthesizer 13c and outputs the inverted second separation signal to the second PD 115.

The second PD 115 detects the phase difference between the inverted reference signal output from the third inverter 113 and the inverted second separation signal output from the fourth inverter 114, and outputs a phase difference signal indicating the phase difference to the adder 116.

The adder 116 calculates the sum of the phase difference signal output from the first PD 112 and the phase difference signal output from the second PD 115, and outputs a sum signal indicating the calculated sum to the LF 117.

In a case where each of the first PD 112 and the second PD 115 is, for example, a current-output type phase comparator implemented using a charge pump, the adder 116 is implemented by a current adder.

The LF 117 smooths the sum signal output from the adder 116 and generates a delay control voltage on the basis of the smoothed sum signal.

The LF 117 controls the delay amount of the first synthesized signal c1 in the first signal delay unit 12a by outputting the generated delay control voltage to the first signal delay unit 12a.

The LF 117 controls the delay amount of the second synthesized signal c2 in the second signal delay unit 12b by outputting the generated delay control voltage to the second signal delay unit 12b.

The clock reception circuit 21 illustrated in FIG. 26 includes the duty ratio adjusting circuit 25.

The duty ratio adjusting circuit 25 adjusts the duty ratio of the first separation signal (1) output from the output point 24.

The duty ratio adjusting circuit 25 outputs the first separation signal having the adjusted duty ratio to the outside of the circuit as a clock signal.

Next, operations of the delay synchronization circuit 3 and the clock reception circuit 21 illustrated in FIG. 26 will be described. Note that since the clock transmission and reception circuit is similar to the clock transmission and reception circuit according to the ninth embodiment except for the delay-amount control circuit 111 and the duty ratio adjusting circuit 25, the operations of the delay-amount control circuit 111 and the duty ratio adjusting circuit 25 will be mainly described here.

Figure 27:
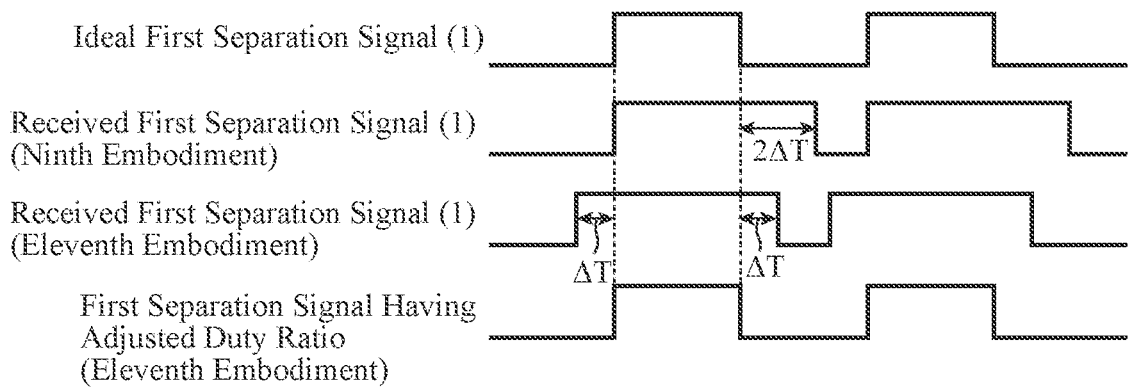
FIG. 27 is an explanatory diagram illustrating waveforms of various signals related to the clock reception circuit 21.

FIG. 27 is an explanatory diagram illustrating waveforms of various signals related to the clock reception circuit 21.

Similarly to the PD 16 illustrated in FIG. 1, the first PD 112 acquires the reference signal from the reference signal generating circuit 2 and the second separation signal (2) from the first edge synthesizer 13c.

The first PD 112 detects a phase difference $\Delta T$ between the reference signal and the second separation signal (2), and outputs a phase difference signal Ph1 indicating the phase difference $\Delta T$ to the adder 116. The phase difference $\Delta T$ is a difference between the phase of the rising edge of the reference signal and the phase of the rising edge of the second separation signal (2).

The third inverter 113 acquires the reference signal from the reference signal generating circuit 2.

The third inverter 113 inverts the reference signal and outputs the inverted reference signal to the second PD 115.

The fourth inverter 114 acquires the second separation signal (2) from the first edge synthesizer 13c.

The fourth inverter 114 inverts the second separation signal (2) and outputs the inverted second separation signal to the second PD 115.

The second PD 115 acquires the inverted reference signal from the third inverter 113 and the inverted second separation signal from the fourth inverter 114.

The second PD 115 detects a phase difference $-\Delta T$ between the inverted reference signal and the inverted second separation signal, and outputs a phase difference signal Ph2 indicating the phase difference $-\Delta T$ to the adder 116. The phase difference $-\Delta T$ is a difference between the phase of the falling edge of the reference signal output from the reference signal generating circuit 2 and the phase of the falling edge of the second separation signal (2) output from the first edge synthesizer 13c.

The adder 116 acquires the phase difference signal Ph1 from the first PD112 and the phase difference signal Ph2 from the second PD 115.

The adder 116 calculates the sum of the phase difference signal Ph1 and the phase difference signal Ph2, and outputs a sum signal Ph1+Ph2 indicating the calculated sum to the LF 117.

The LF 117 smooths the sum signal Ph1+Ph2 output from the adder 116.

The LF 117 generates a delay control voltage on the basis of the smoothed sum signal. The delay control voltage generated by the LF 117 is a control voltage at which the average of the phase difference $\Delta T$ between the reference signal and the second separation signal (2) and the phase difference $-\Delta T$ between the inverted reference signal and the inverted second separation signal is minimized.

The LF 117 controls the delay amount of the first synthesized signal c1 in the first signal delay unit 12a by outputting the generated delay control voltage to the first signal delay unit 12a.

The LF 117 controls the delay amount of the second synthesized signal c2 in the second signal delay unit 12b by outputting the generated delay control voltage to the second signal delay unit 12b.

By controlling each of the delay amount of the first synthesized signal c1 and the delay amount of the second synthesized signal c2, negative feedback is applied so that the average of the phase difference $\Delta T$ between the reference signal and the second separation signal (2) and the phase difference $-\Delta T$ between the inverted reference signal and the inverted second separation signal is minimized. As a result, when there is a difference in variable delay characteristics between the first signal delay unit 12a and the second signal delay unit 12b, the signs of the components of disturbance remaining at the rising edge and the falling edge in the first separation signal (1) received by the circulator 22 of the clock reception circuit 21 are opposite to each other.

When receiving the first synthesized signal c1 from the first pulse synthesizer 11a, the first signal delay unit 12a delays the first synthesized signal c1 and outputs the delayed first synthesized signal to the first pulse separator 13a as the first delay signal d1. The delay amount of the first synthesized signal c1 is controlled by the LF 117.

When receiving the second synthesized signal c2 from the second pulse synthesizer 11d, the second signal delay unit 12b delays the second synthesized signal c2 and outputs the delayed second synthesized signal to the second pulse separator 13b as the second delay signal d2. The delay amount of the second synthesized signal c2 is controlled by the LF 117.

The circulator 22 of the clock reception circuit 21 receives the first separation signal (1) output from the circulator 14 of the delay synchronization circuit 3.

The first separation signal (1) received by the circulator 22 is output from the output point 24 to the duty ratio adjusting circuit 25.

In addition, the circulator 22 outputs the received first separation signal (1) to the circulator 14 of the delay synchronization circuit 3 via the cable 20.

For example, as illustrated in FIG. 27, the phase of the rising edge of the first separation signal (1) received by the circulator 22 advances ahead the phase of the rising edge of an ideal first separation signal (1) by $\Delta T$.

For example, as illustrated in FIG. 27, the phase of the falling edge of the first separation signal (1) received by the circulator 22 is delayed from the phase of the falling edge of the ideal first separation signal (1) by $\Delta T$.

For example, as illustrated in FIG. 27, the phase of the rising edge of the first separation signal (1) received by the circulator 22 illustrated in FIG. 20 matches the phase of the rising edge of the ideal first separation signal (1).

For example, as illustrated in FIG. 27, the phase of the falling edge of the first separation signal (1) received by the circulator 22 illustrated in FIG. 20 is delayed from the phase of the falling edge of the ideal first separation signal (1) by $2\Delta T$.

The duty ratio adjusting circuit 25 acquires the first separation signal (1) from the output point 24.

Figure 28:
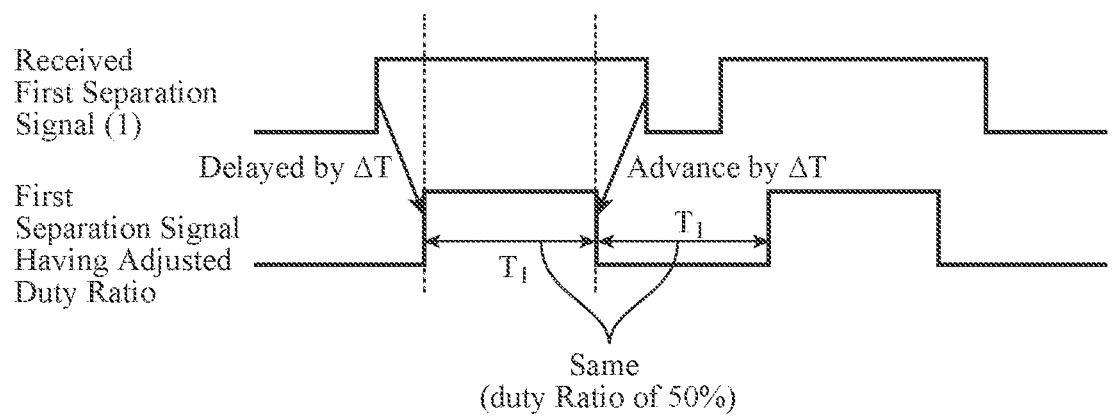
FIG. 28 is an explanatory diagram illustrating a duty ratio adjusting process performed by a duty ratio adjusting circuit 25.

As illustrated in FIG. 28, the duty ratio adjusting circuit 25 adjusts the duty ratio of the first separation signal (1) by delaying the phase of the rising edge of the first separation signal (1) by $\Delta T$ and advancing the phase of the falling edge of the first separation signal (1) by $\Delta T$.

FIG. 28 is an explanatory diagram illustrating a duty ratio adjusting process performed by the duty ratio adjusting circuit 25.

By the duty ratio adjusting circuit 25 adjusting the duty ratio of the first separation signal (1), the component of disturbance remaining at the rising edge and the component of disturbance remaining at the falling edge in the received first separation signal (1) cancel each other. As a result, the disturbance to both the rising edge and the falling edge is suppressed.

In the example of FIG. 28, by the duty ratio adjusting circuit 25 adjusting the duty ratio of the first separation signal (1), the duty ratio of the first separation signal (1) is 50%. In FIG. 28, Ti indicates each of H-level time and L-level time in the first separation signal (1) after duty ratio adjustment, and the H-level time and the L-level time are the same.

As illustrated in FIG. 27, the duty ratio adjusting circuit 25 outputs the first separation signal having the adjusted duty ratio to the outside of the circuit as a clock signal.

Figure 29:
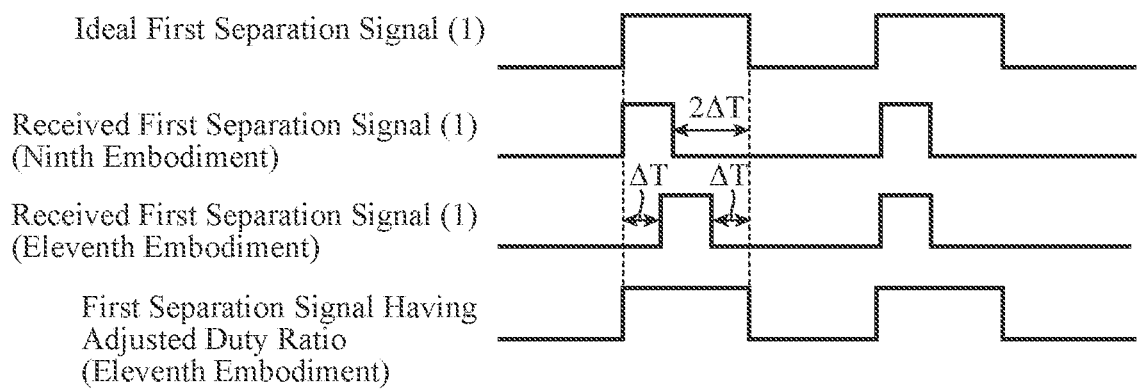
FIG. 29 is an explanatory diagram illustrating waveforms of various signals related to the clock reception circuit 21.

In the example of FIG. 27, the phase of the rising edge of the first separation signal (1) received by the circulator 22 advances ahead the phase of the rising edge of the ideal first separation signal (1) by $\Delta T$. In addition, the phase of the falling edge of the first separation signal (1) is delayed from the phase of the falling edge of the ideal first separation signal (1) by $\Delta T$. However, this is only an example, and as illustrated in FIG. 29, the phase of the rising edge of the first separation signal (1) received by the circulator 22 is delayed by $\Delta T$ from the phase of the rising edge of the ideal first separation signal (1). In addition, the phase of the falling edge of the first separation signal (1) may advance ahead the phase of the falling edge of the ideal first separation signal (1) by $\Delta T$. FIG. 29 is an explanatory diagram illustrating waveforms of various signals related to the clock reception circuit 21.

Figure 30:
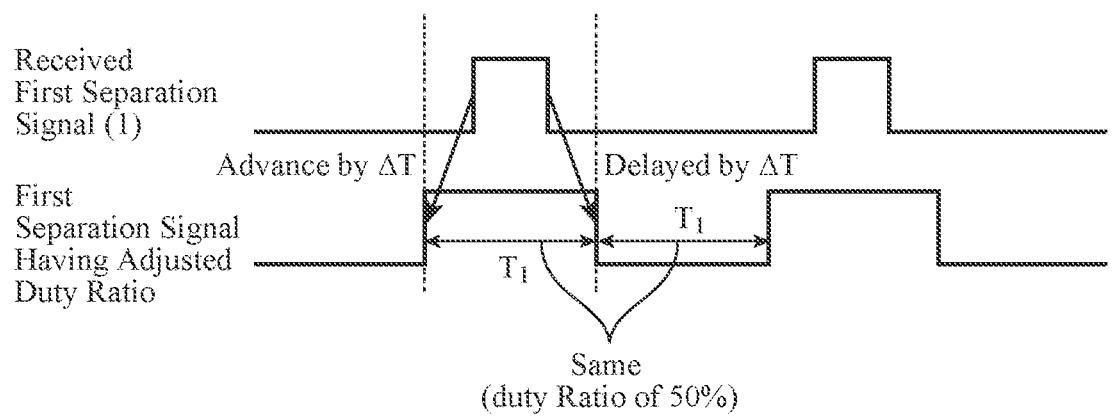
FIG. 30 is an explanatory diagram illustrating the duty ratio adjusting process performed by the duty ratio adjusting circuit 25.

In such a case, as illustrated in FIG. 30, the duty ratio adjusting circuit 25 adjusts the duty ratio of the first separation signal (1) by advancing the phase of the rising edge of the first separation signal (1) by $\Delta T$ and delaying the phase of the falling edge of the first separation signal (1) by $\Delta T$.

FIG. 30 is an explanatory diagram illustrating a duty ratio adjusting process performed by the duty ratio adjusting circuit 25.

Twelfth Embodiment

In a twelfth embodiment, a clock transmission and reception circuit in which the duty ratio adjusting circuit 25 includes a double multiplier 26 and a phase locked loop 27 will be described.

Figure 31:
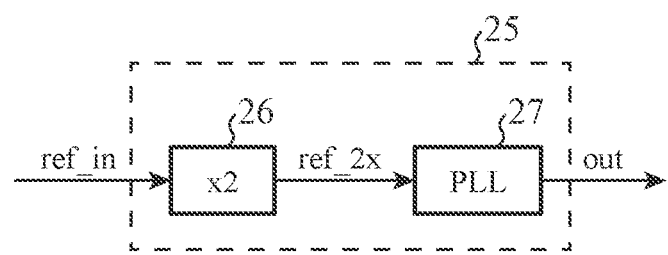
FIG. 31 is a configuration diagram illustrating a duty ratio adjusting circuit 25 of a clock transmission and reception circuit according to a twelfth embodiment.

FIG. 31 is a configuration diagram illustrating the duty ratio adjusting circuit 25 of the clock transmission and reception circuit according to the twelfth embodiment.

The duty ratio adjusting circuit 25 illustrated in FIG. 31 includes the double multiplier 26 and the phase locked loop (hereinafter, referred to as "PLL") 27.

The double multiplier 26 multiplies the frequency of the first separation signal (1) output from the output point 24 by two, and outputs the first separation signal after frequency multiplication by two to the PLL 27.

The PLL 27 adjusts the duty ratio of the first separation signal output from the double multiplier 26, and outputs the first separation signal having the adjusted duty ratio to the outside of the circuit as a clock signal.

Figure 32:
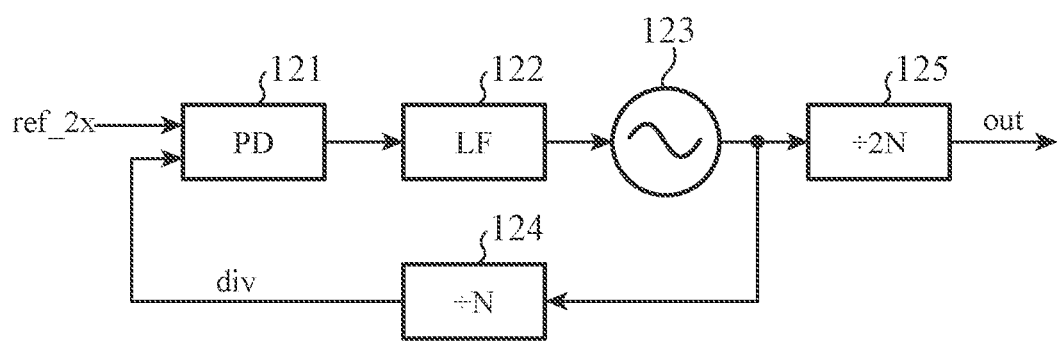
FIG. 32 is a configuration diagram illustrating the inside of a PLL 27.

FIG. 32 is a configuration diagram illustrating the inside of the PLL 27.

The PLL 27 illustrated in FIG. 32 includes a PD 121, an LF 122, a voltage controlled oscillator (hereinafter referred to as "VCO") 123, a divide-by-N frequency divider 124, and a divide-by-2N frequency divider 125.

The PD 121 detects a phase difference $\Delta T$ between the phase of the rising edge of a first separation signal ref_$2x$ after frequency multiplication by two, which is output from the double multiplier 26, and the phase of the rising edge of a signal div frequency-divided by N, which is output from the divide-by-N frequency divider 124, and outputs a phase difference signal indicating the phase difference $\Delta T$ to the LF 122.

The PD 121 detects a phase difference $-\Delta T$ between the phase of the falling edge of the first separation signal ref_$2x$ after frequency multiplication by two and the phase of the falling edge of the signal div frequency-divided by N, which is output from the divide-by-N frequency divider 124, and outputs a phase difference signal indicating the phase difference $-\Delta T$ to the LF 122.

The LF 122 smooths the phase difference signal output from the PD 121. In each of the first separation signal ref_$2x$ after frequency multiplication by two and the signal div frequency-divided by N frequency division, the rising edge and the falling edge alternately appear. By the LF 122 smoothing the phase difference signal, the average of the phase difference ΔT and the phase difference −ΔT is calculated.

The VCO 123 outputs a signal that allows the phase difference indicated by the phase difference signal smoothed by the LF 122 to be minimized to each of the divide-by-N frequency divider 124 and the divide-by-2N frequency divider 125.

The divide-by-N frequency divider 124 divides the frequency of the output signal of the VCO 123 by N, and outputs a signal div frequency-divided by N to the PD 121. N is a positive integer equal to or larger than one. The value of N is determined in accordance with the frequency of a desired clock signal output from the clock reception circuit 21.

The divide-by-2N frequency divider 125 divides the frequency of the output signal of the VCO 123 by 2N, and outputs the signal frequency-divided by 2N to the outside of the circuit as a clock signal out.

Figure 33:
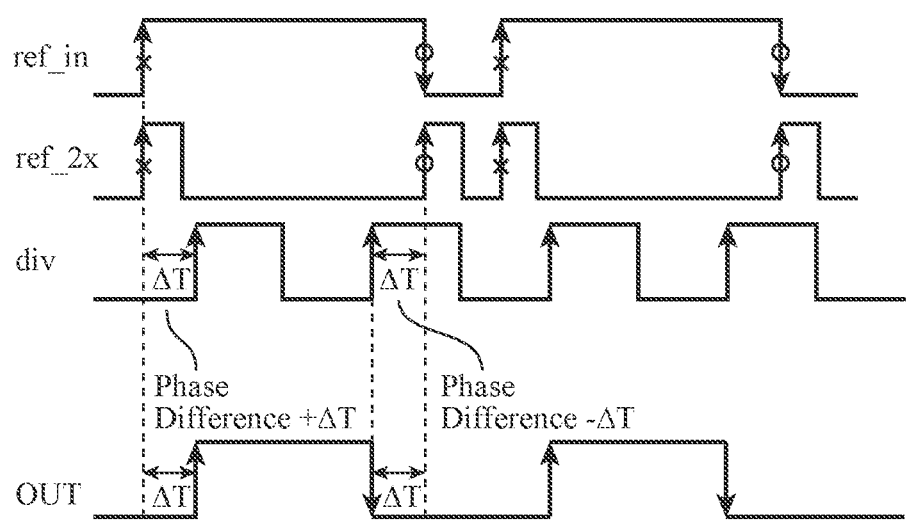
FIG. 33 is an explanatory diagram illustrating waveforms of various signals related to the duty ratio adjusting circuit 25.

FIG. 33 is an explanatory diagram illustrating waveforms of various signals related to the duty ratio adjusting circuit 25. In the example of FIG. 33, N=1, and the divide-by-N frequency divider 124 does not divide the frequency of the output signal of the VCO 123. In addition, the divide-by-2N frequency divider 125 divides the frequency of the output signal of the VCO 123 by two.

Next, an operation of the duty ratio adjusting circuit 25 illustrated in FIG. 31 will be described.

When receiving a first separation signal (1) ref in from the output point 24, the double multiplier 26 multiplies the frequency of the first separation signal (1) ref in by two.

That is, as illustrated in FIG. 33, the double multiplier 26 generates a signal (a first separation signal ref_2x after frequency multiplication by two) having a rising edge synchronized with the rising edge of the first separation signal (1) ref in and a rising edge synchronized with the falling edge of the first separation signal (1) ref in as the rising edge.

The double multiplier 26 outputs the first separation signal ref_2x after frequency multiplication by two to the PD 121 of the PLL 27.

The PD 121 acquires the first separation signal ref_2x after frequency multiplication by two from the double multiplier 26, and the signal div frequency-divided by N from the divide-by-N frequency divider 124.

As illustrated in FIG. 33, the PD 121 detects ΔT or −ΔT as a phase difference between the phase of the rising edge of the first separation signal ref_2x and the phase of the rising edge of the signal div frequency-divided by N.

The PD 121 outputs a phase difference signal indicating the phase difference ΔT or a phase difference signal indicating the phase difference −ΔT to the LF 122.

The LF 122 smooths the phase difference signal output from the PD 121. By the LF 122 smoothing the phase difference signal, the average of the phase difference ΔT and the phase difference −ΔT is calculated.

The VCO 123 acquires the phase difference signal smoothed by the LF 122.

The VCO 123 outputs a signal that allows the phase difference indicated by the smoothed phase difference signal to be minimized to each of the divide-by-N frequency divider 124 and the divide-by-2N frequency divider 125.

The divide-by-N frequency divider 124 divides the frequency of the output signal of the VCO 123 by N, and outputs a signal div frequency-divided by N to the PD 121.

The divide-by-2N frequency divider 125 divides the frequency of the output signal of the VCO 123 by 2N, and outputs the signal frequency-divided by 2N to the outside of the circuit as a clock signal out.

Note that it is possible to freely combine the embodiments, modify any component of each embodiment, or omit any component of each embodiment in the present disclosure.

INDUSTRIAL APPLICABILITY

The present disclosure is suitable for a delay synchronization circuit, a clock transmission circuit including the delay synchronization circuit, and a clock transmission and reception circuit including the delay synchronization circuit.

REFERENCE SIGNS LIST

1: clock transmission circuit, 2: reference signal generating circuit, 3: delay synchronization circuit, 10: input terminal, 11: pulse synthesizing circuit, 11a: first pulse synthesizer, 11b: first inverter, 11c: second inverter, 11d: second pulse synthesizer, 12: VCDL, 12a: first signal delay unit, 12b: second signal delay unit, 13: pulse separation circuit, 13a: first pulse separator, 13b: second pulse separator, 13c: first edge synthesizer, 13d: second edge synthesizer, 14: circulator, 14a: input and output terminal, 15: delay-amount control circuit, 16: PD, 17: LF, 18: input and output terminal, 20: cable, 21: clock reception circuit, 22: circulator, 22a: input and output terminal, 23: input and output point, 24: output point, 25: duty ratio adjusting circuit, 26: double multiplier, 27: PLL, 31: offset control circuit, 32: PD, 33: offset control processing circuit, 34: delay-amount control circuit, 35: PD, 35a: PD core, 35b: adder, 41: first phase shifter, 42: second phase shifter, 43: third phase shifter, 44: fourth phase shifter, 45: fifth phase shifter, 46: sixth phase shifter, 47: phase-shift-amount control circuit, 48: PD, 49: phase-shift-amount control processing circuit, 51: first inverter, 52: first multiplexer, 61: first divide-by-two frequency divider, 62: seventh phase shifter, 63: second divide-by-two frequency divider, 64: eighth phase shifter, 65: phase-shift-amount control circuit, 66: phase-shift-amount control processing circuit, 71: pulse synthesizing circuit, 72: first exclusive OR circuit, 73: phase difference quantizer, 74: pulse separation circuit, 75: second inverter, 76: second multiplexer, 77: third divide-by-two frequency divider, 78: fourth divide-by-two frequency divider, 81: first ratio control circuit, 82: second ratio control circuit, 83: OR circuit, 91: delay circuit, 92: logic circuit, 93: fifth divide-by-two frequency divider, 101: sixth divide-by-two frequency divider, 102: seventh divide-by-two frequency divider, 103: second exclusive OR circuit, 104: eighth divide-by-two frequency divider, 105: ninth divide-by-two frequency divider, 106: third exclusive OR circuit, 111: delay-amount control circuit, 112: first PD, 113: third inverter, 114: fourth inverter, 115: second PD, 116: adder, 117: LF, 121: PD, 122: LF, 123: VCO, 124: divide-by-N frequency divider, 125: divide-by-2N frequency divider

The invention claimed is:
1. A delay synchronization circuit comprising:
a pulse synthesizing circuit to generate a synthesized signal including a first pulse signal synchronized with a reference signal and a second pulse signal synchronized a feedback signal;
a signal delay circuit to delay a synthesized signal generated by the pulse synthesizing circuit and output a delay signal that is a delayed synthesized signal;
a pulse separation circuit to generate a first separation signal synchronized with a first pulse signal included in a delay signal output from the signal delay circuit and generate a second separation signal synchronized with a second pulse signal included in the delay signal;

a circulator to output a first separation signal generated by the pulse separation circuit to a clock reception circuit and then output the first separation signal returned from the clock reception circuit to the pulse synthesizing circuit as the feedback signal; and a delay-amount control circuit to control a delay amount of a synthesized signal in the signal delay circuit in accordance with a phase difference between the reference signal and the second separation signal generated by the pulse separation circuit.

2. The delay synchronization circuit according to claim 1 further comprising an offset control circuit to output an offsetting signal issuing an instruction to give an offset when a phase difference between the reference signal and the feedback signal is equal to or less than a threshold, wherein the delay-amount control circuit is configured in such a way that when an offsetting signal is output from the offset control circuit, the delay-amount control circuit offsets a phase difference between the reference signal and the second separation signal, and controls a delay amount of the synthesized signal in the signal delay circuit in accordance with a phase difference after offset.

3. The delay synchronization circuit according to claim 1 further comprising:

a first phase shifter to shift a phase of the reference signal by a first phase-shift amount and output a phase-shifted reference signal;

a second phase shifter to shift a phase of a phase-shifted reference signal output from the first phase shifter by a second phase-shift amount and output a reference signal phase-shifted by the second phase-shift amount to the delay-amount control circuit;

a third phase shifter to shift a phase of a phase-shifted reference signal output from the first phase shifter by a third phase-shift amount and output a reference signal phase-shifted by the third phase-shift amount to the pulse synthesizing circuit;

a fourth phase shifter to shift a phase of the first separation signal generated by the pulse separation circuit by a fourth phase-shift amount and output a phase-shifted first separation signal to the circulator;

a fifth phase shifter to shift a phase of the feedback signal output from the circulator by a fifth phase-shift amount and output a phase-shifted feedback signal to the pulse synthesizing circuit;

a sixth phase shifter to shift a phase of the second separation signal generated by the pulse separation circuit by a sixth phase-shift amount and output a phase-shifted second separation signal to the delay-amount control circuit; and a phase-shift-amount control circuit to compare a phase difference between a reference signal output from the third phase shifter and a feedback signal output from the fifth phase shifter with a threshold, and control each of a first phase-shift amount in the first phase shifter, a second phase-shift amount in the second phase shifter, a third phase-shift amount in the third phase shifter, a fourth phase-shift amount in the fourth phase shifter, a fifth phase-shift amount in the fifth phase shifter, and a sixth phase-shift amount in the sixth phase shifter on a basis of a result of comparison between the phase difference and the threshold.

4. The delay synchronization circuit according to claim 3, wherein each of the first phase shifter, the second phase shifter, the third phase shifter, the fourth phase shifter, the fifth phase shifter, and the sixth phase shifter includes a first inverter to invert an input signal and output an inverted signal, and a first multiplexer to select one of the input signal and the inverted signal output from the first inverter on a basis of a phase shift amount controlled by the phase-shift-amount control circuit and output a selected signal.

5. The delay synchronization circuit according to claim 3 further comprising:

a first divide-by-two frequency divider to divide a frequency of a phase-shifted reference signal output from the second phase shifter by two and output a reference signal frequency-divided by two;

a seventh phase shifter to shift a phase of a reference signal frequency-divided by two, the reference signal being output from the first divide-by-two frequency divider, by a seventh phase-shift amount and output a reference signal phase-shifted by the seventh phase-shift amount to the delay-amount control circuit;

a second divide-by-two frequency divider to divide a frequency of a phase-shifted second separation signal output from the sixth phase shifter by two and output a second separation signal frequency-divided by two; and an eighth phase shifter to shift a phase of a second separation signal frequency-divided by two, the second separation signal being output from the second divide-by-two frequency divider, by an eighth phase-shift amount and output a second separation signal phase-shifted by the eighth phase-shift amount to the delay-amount control circuit, wherein the phase-shift-amount control circuit controls each of a first phase-shift amount in the first phase shifter, a second phase-shift amount in the second phase shifter, a third phase-shift amount in the third phase shifter, a fourth phase-shift amount in the fourth phase shifter, a fifth phase-shift amount in the fifth phase shifter, a sixth phase-shift amount in the sixth phase shifter, a seventh phase-shift amount in the seventh phase shifter, and an eighth phase-shift amount in the eighth phase shifter.

6. The delay synchronization circuit according to claim 5, wherein each of the first phase shifter, the second phase shifter, the third phase shifter, the fourth phase shifter, the fifth phase shifter, the sixth phase shifter, the seventh phase shifter, and the eighth phase shifter includes a first inverter to invert an input signal and output an inverted signal, and a first multiplexer to select one of the input signal and the inverted signal output from the first inverter on a basis of a phase shift amount controlled by the phase-shift-amount control circuit and output a selected signal.

7. The delay synchronization circuit according to claim 1, wherein the pulse synthesizing circuit includes a first exclusive OR circuit to calculate exclusive OR of the reference signal and the feedback signal and output a synthesized signal indicating a calculation result of the exclusive OR to the signal delay circuit instead of generating a synthesized signal including a first pulse signal synchronized with the reference signal and a second pulse signal synchronized with the feedback signal.

8. The delay synchronization circuit according to claim 7, further comprising a phase difference quantizer to compare a phase of the reference signal with a phase of the feedback signal and output a selection signal indicating a signal to be selected on a basis of a phase comparison result, wherein
the pulse separation circuit includes
a second inverter to invert the delay signal and output an inverted delay signal
instead of generating a first separation signal synchronized with a first pulse signal included in a delay signal output from the signal delay circuit and generating a second separation signal synchronized with a second pulse signal included in the delay signal,
a second multiplexer to select one of a delay signal output from the signal delay circuit and a delay signal output from the second inverter on a basis of a selection signal output from the phase difference quantizer, and output a selected delay signal,
a third divide-by-two frequency divider to divide a frequency of a delay signal output from the second multiplexer by two and output a delay signal frequency-divided by two to the circulator as the first separation signal, and
a fourth divide-by-two frequency divider to invert a delay signal output from the second multiplexer, divide a frequency of an inverted delay signal by two, and output a delay signal frequency-divided by two to the delay-amount control circuit as the second separation signal.

9. The delay synchronization circuit according to claim 1, wherein
the pulse synthesizing circuit includes
a first ratio control circuit to reduce a duty ratio of the reference signal,
a second ratio control circuit to reduce a duty ratio of the feedback signal, and
an OR circuit to calculate OR of a reference signal having a duty ratio reduced by the first ratio control circuit and a feedback signal having a duty ratio reduced by the second ratio control circuit and output a synthesized signal indicating a calculation result of the OR to the signal delay circuit.

10. The delay synchronization circuit according to claim 9, wherein
the pulse separation circuit includes a fifth divide-by-two frequency divider to divide a frequency of a delay signal output from the signal delay circuit by two, output a delay signal frequency-divided by two to the circulator as the first separation signal, and output an inverted signal of a delay signal frequency-divided by two to the delay-amount control circuit as the second separation signal.

11. The delay synchronization circuit according to claim 1, wherein
the pulse synthesizing circuit includes
a first pulse synthesizer to generate a third pulse signal rising at a same timing as the reference signal, generate a fourth pulse signal rising at the same timing as the feedback signal, and generate a first synthesized signal including the third pulse signal and the fourth pulse signal,
a first inverter to invert the reference signal and output an inverted reference signal,
a second inverter to invert the feedback signal and output an inverted feedback signal, and
a second pulse synthesizer to generate a fifth pulse signal rising at the same timing as an inverted reference signal output from the first inverter, generate a sixth pulse signal rising at the same timing as an inverted feedback signal output from the second inverter, and generate a second synthesized signal including the fifth pulse signal and the sixth pulse signal,
the signal delay circuit includes
a first signal delayer to delay a first synthesized signal generated by the first pulse synthesizer and output a delayed first synthesized signal as a first delay signal, and
a second signal delayer to delay a second synthesized signal generated by the second pulse synthesizer and output a delayed second synthesized signal as a second delay signal, and
the pulse separation circuit includes
a first pulse separator to generate a third separation signal rising at the same timing as a third pulse signal included in a first delay signal output from the first signal delayer, and generate a fourth separation signal rising at the same timing as a fourth pulse signal included in the first delay signal,
a second pulse separator to generate a fifth separation signal rising at the same timing as a fifth pulse signal included in a second delay signal output from the second signal delayer, and generate a sixth separation signal rising at the same timing as a sixth pulse signal included in the second delay signal,
a first edge synthesizer to generate the second separation signal from the fourth separation signal and the sixth separation signal and output the second separation signal to the delay-amount control circuit, and
a second edge synthesizer to generate the first separation signal from the third separation signal and the fifth separation signal and output the first separation signal to the circulator.

12. The delay synchronization circuit according to claim 11, wherein
the first edge synthesizer includes
a sixth divide-by-two frequency divider to divide a frequency of the fourth separation signal by two and output a fourth separation signal frequency-divided by two,
a seventh divide-by-two frequency divider to divide a frequency of the sixth separation signal by two and output a sixth separation signal frequency-divided by two, and
a second exclusive OR circuit to calculate exclusive OR of a fourth separation signal frequency-divided by two, the fourth separation signal being output from the sixth divide-by-two frequency divider, and the sixth separation signal frequency-divided by two, the sixth separation signal being output from the seventh divide-by-two frequency divider, and generate a signal indicating a calculation result of the exclusive OR as the second separation signal, and
the second edge synthesizer includes
an eighth divide-by-two frequency divider to divide a frequency of the third separation signal by two and output a third separation signal frequency-divided by two,
a ninth divide-by-two frequency divider to divide a frequency of the fifth separation signal by two and output a fifth separation signal frequency-divided by two, and
a third exclusive OR circuit to calculate exclusive OR of a third separation signal frequency-divided by two, the third separation signal being output from the eighth divide-by-two frequency divider, and a fifth separation signal frequency-divided by two, the fifth separation signal being output from the ninth divide-by-two frequency divider, and generate a signal indicating a calculation result of the exclusive OR as the first separation signal.

13. The delay synchronization circuit according to claim 11, wherein
the delay-amount control circuit includes
a first phase detector to detect a phase difference between the reference signal and a second separation signal output from the first edge synthesizer,
a third inverter to invert the reference signal and output an inverted reference signal,
a fourth inverter to invert a second separation signal output from the first edge synthesizer and output an inverted second separation signal, and
a second phase detector to detect a phase difference between an inverted reference signal output from the third inverter and an inverted second separation signal output from the fourth inverter, and
the delay-amount control circuit controls each of a delay amount of a first synthesized signal in the first signal delayer and a delay amount of a second synthesized signal in the second signal delayer in accordance with a phase difference detected by the first phase detector and a phase difference detected by the second phase detector.

14. A clock transmission circuit comprising:
the delay synchronization circuit according to claim 1; and
a reference signal generating circuit to generate a reference signal and output the reference signal to the delay synchronization circuit.

15. A clock transmission and reception circuit comprising:
the delay synchronization circuit according to claim 1;
a reference signal generating circuit to generate a reference signal and output the reference signal to the delay synchronization circuit; and
a clock reception circuit to receive a first separation signal output from the circulator and return the first separation signal received to the circulator.

16. A clock transmission and reception circuit comprising:
the delay synchronization circuit according to claim 13;
a reference signal generating circuit to generate a reference signal and output the reference signal to the delay synchronization circuit; and
a clock reception circuit to receive a first separation signal output from the circulator and return the first separation signal received to the circulator, wherein
the clock reception circuit includes a duty ratio adjusting circuit to adjust a duty ratio of a first separation signal received and output a first separation signal having an adjusted duty ratio as a clock signal.

17. The clock transmission and reception circuit according to claim 16, wherein
the duty ratio adjusting circuit includes
a double multiplier to multiply a frequency of a first separation signal received and output a first separation signal after frequency multiplication by two and
a phase locked loop to adjust a duty ratio of a first separation signal output from the double multiplier.

* * * * *